US011282763B2

(12) United States Patent
Kim et al.

(10) Patent No.: US 11,282,763 B2
(45) Date of Patent: Mar. 22, 2022

(54) SEMICONDUCTOR DEVICE HAVING A LID WITH THROUGH-HOLES

(71) Applicant: Amkor Technology Singapore Holding Pte. Ltd., Singapore OT (SG)

(72) Inventors: Keun Soo Kim, Hsinchu (TW); Young Ik Kwon, Taichung (TW); Yu Jin Jeon, Gyeonggi-do (KR); Mi Kyoung Choi, Incheon (KR)

(73) Assignee: Amkor Technology Singapore Holding Pte. Ltd., Singapore (SG)

(*) Notice: Subject to any disclaimer, the term of this patent is extended or adjusted under 35 U.S.C. 154(b) by 0 days.

(21) Appl. No.: 16/450,680

(22) Filed: Jun. 24, 2019

(65) Prior Publication Data

US 2020/0402885 A1    Dec. 24, 2020

(51) Int. Cl.
| | |
|---|---|
| *H01L 23/36* | (2006.01) |
| *H01L 23/31* | (2006.01) |
| *H01L 23/42* | (2006.01) |
| *H01L 23/46* | (2006.01) |
| *H01L 23/49* | (2006.01) |
| *H01L 25/10* | (2006.01) |
| *H01L 23/367* | (2006.01) |
| *H01L 23/498* | (2006.01) |
| *H01L 21/48* | (2006.01) |

(52) U.S. Cl.
CPC ...... *H01L 23/3675* (2013.01); *H01L 21/4882* (2013.01); *H01L 23/3128* (2013.01); *H01L 23/42* (2013.01); *H01L 23/46* (2013.01); *H01L 23/49822* (2013.01); *H01L 25/105* (2013.01); *H01L 2225/1094* (2013.01); *H01L 2924/161* (2013.01)

(58) Field of Classification Search
CPC . H01L 23/3675; H01L 23/3128; H01L 23/42; H01L 23/46; H01L 23/49822; H01L 25/105; H01L 2924/161; H01L 2924/16151; H01L 2924/16251
See application file for complete search history.

(56) References Cited

U.S. PATENT DOCUMENTS

| | | | | |
|---|---|---|---|---|
| 4,801,998 A | * | 1/1989 | Okuaki | .................. H01L 24/33 257/681 |
| 6,445,062 B1 | * | 9/2002 | Honda | .................... H01L 21/50 257/678 |
| 6,767,765 B2 | * | 7/2004 | Chiu | ....................... H01L 23/04 257/E21.503 |
| 6,891,259 B2 | * | 5/2005 | Im | .......................... H01L 23/42 257/687 |

(Continued)

FOREIGN PATENT DOCUMENTS

JP    2001308215 A  * 11/2001

*Primary Examiner* — Ida M Soward
(74) *Attorney, Agent, or Firm* — Spectrum IP Law Group LLC

(57) ABSTRACT

In one example, a semiconductor device, includes a substrate having a top side and a conductor on the top side of the substrate, an electronic device on the top side of the substrate connected to the conductor on the top side of the substrate via an internal interconnect, a lid covering a top side of the electronic device, and a thermal material between the top side of the electronic device and the lid, wherein the lid has a through-hole. Other examples and related methods are also disclosed herein.

19 Claims, 28 Drawing Sheets

(56) References Cited

U.S. PATENT DOCUMENTS

| | | | | |
|---|---|---|---|---|
| 7,015,577 B2* | 3/2006 | Wang | | H01L 23/3675 257/707 |
| 7,187,077 B1* | 3/2007 | Nagarajan | | H01L 21/50 257/678 |
| 7,218,000 B2* | 5/2007 | Houle | | H01L 23/04 257/687 |
| 7,224,057 B2* | 5/2007 | Yang | | H01L 23/36 257/707 |
| 7,319,051 B2* | 1/2008 | Cheah | | H01L 23/24 438/122 |
| 7,619,308 B1* | 11/2009 | Gektin | | H01L 23/04 257/704 |
| 8,018,072 B1* | 9/2011 | Miks | | H01L 23/4334 257/777 |
| 8,334,592 B2* | 12/2012 | Bhagwagar | | H01L 23/3735 257/729 |
| 8,519,529 B2* | 8/2013 | Ogihara | | H01L 21/563 257/704 |
| 8,710,448 B2* | 4/2014 | Luhta | | H01L 27/14618 250/370.11 |
| 8,922,024 B2* | 12/2014 | Na | | H01L 23/49811 257/774 |
| 9,287,191 B2* | 3/2016 | Liu | | H01L 23/42 |
| 9,716,053 B2* | 7/2017 | Murayama | | H01L 23/373 |
| 10,607,963 B2* | 3/2020 | Brunschwiler | | H01L 21/4803 |
| 10,643,924 B1* | 5/2020 | Shen | | H01L 23/42 |
| 10,727,368 B2* | 7/2020 | Yim | | H01L 25/167 |
| 11,075,138 B2* | 7/2021 | Kwon | | H01L 25/105 |
| 2001/0013640 A1* | 8/2001 | Tao | | H01L 23/055 257/667 |
| 2003/0134454 A1* | 7/2003 | Houle | | H01L 23/3736 438/122 |
| 2005/0224953 A1* | 10/2005 | Lee | | H01L 23/24 257/704 |
| 2007/0138621 A1* | 6/2007 | Sane | | H01L 24/32 257/704 |
| 2008/0116586 A1* | 5/2008 | Kim | | H01L 21/4871 257/778 |
| 2009/0026632 A1* | 1/2009 | Shen | | H01L 24/29 257/777 |
| 2009/0166830 A1* | 7/2009 | Li | | H01L 23/04 257/678 |
| 2015/0187679 A1* | 7/2015 | Ho | | H01L 23/367 257/690 |
| 2015/0279761 A1* | 10/2015 | Bet-Shliemoun | | H01L 23/42 257/714 |
| 2017/0162517 A1* | 6/2017 | Li | | H01L 23/49838 |
| 2018/0005985 A1* | 1/2018 | Hsieh | | H01L 23/367 |
| 2018/0269126 A1* | 9/2018 | Im | | H01L 23/3736 |
| 2018/0294206 A1* | 10/2018 | Chainer | | H01L 25/50 |
| 2019/0393118 A1* | 12/2019 | Rawlings | | H01L 21/54 |
| 2020/0043829 A1* | 2/2020 | Elsherbini | | H01L 23/473 |
| 2020/0051888 A1* | 2/2020 | Lin | | H01L 25/50 |
| 2020/0051894 A1* | 2/2020 | Wan | | H01L 23/42 |
| 2020/0211927 A1* | 7/2020 | Wan | | H01L 21/4882 |

* cited by examiner

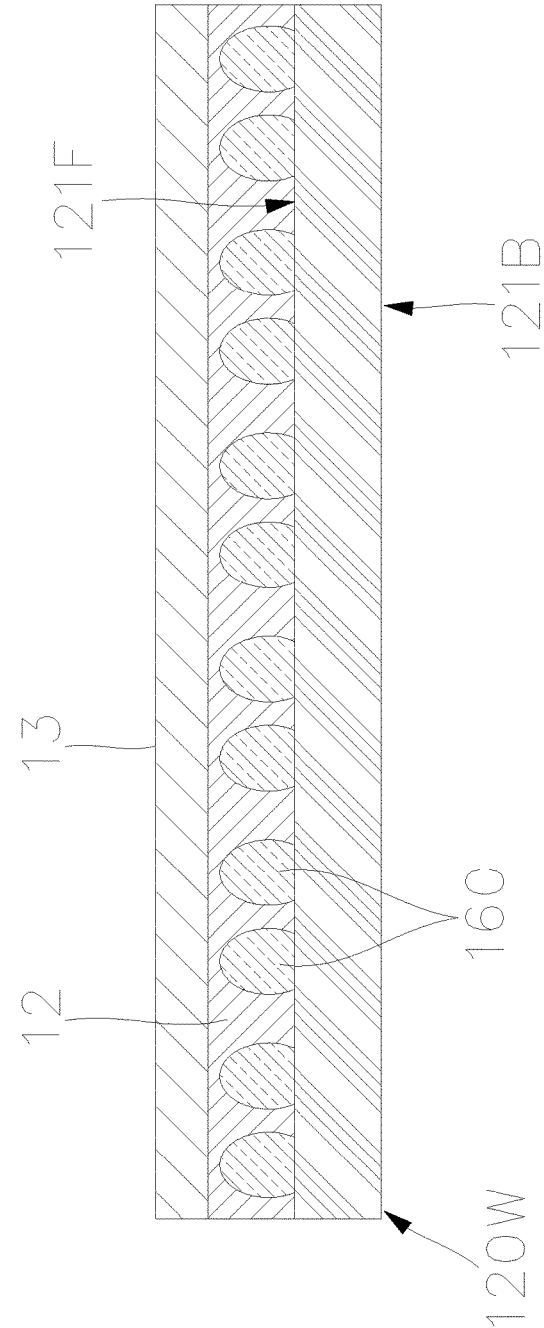
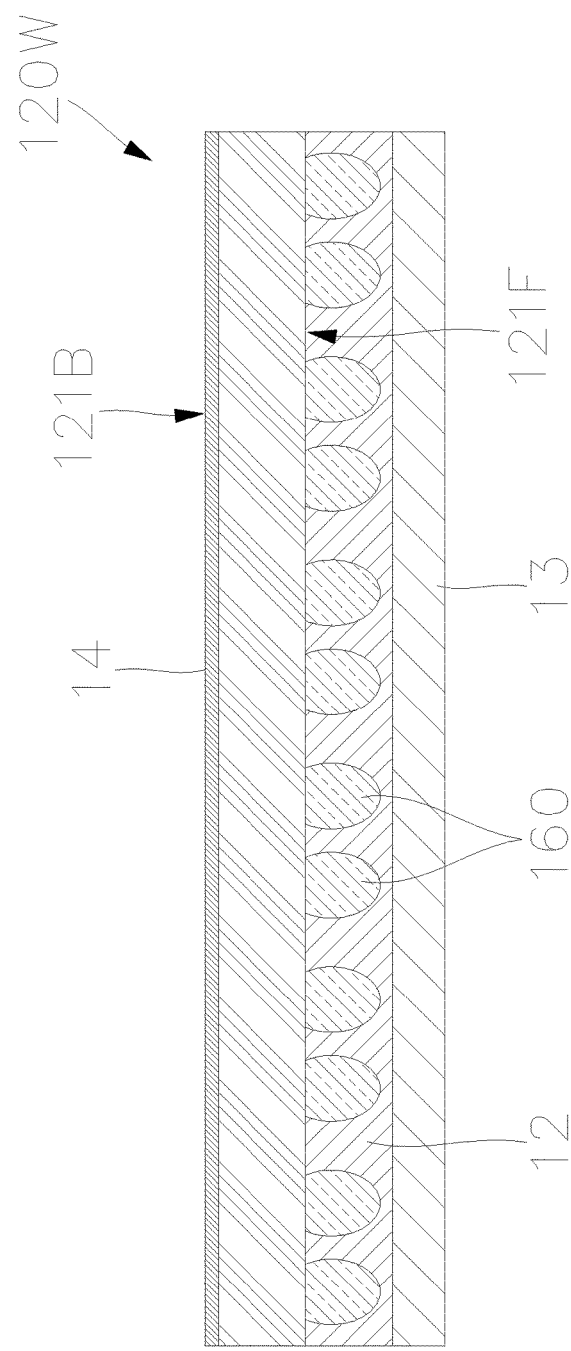
FIG. 5A
FIG. 5B

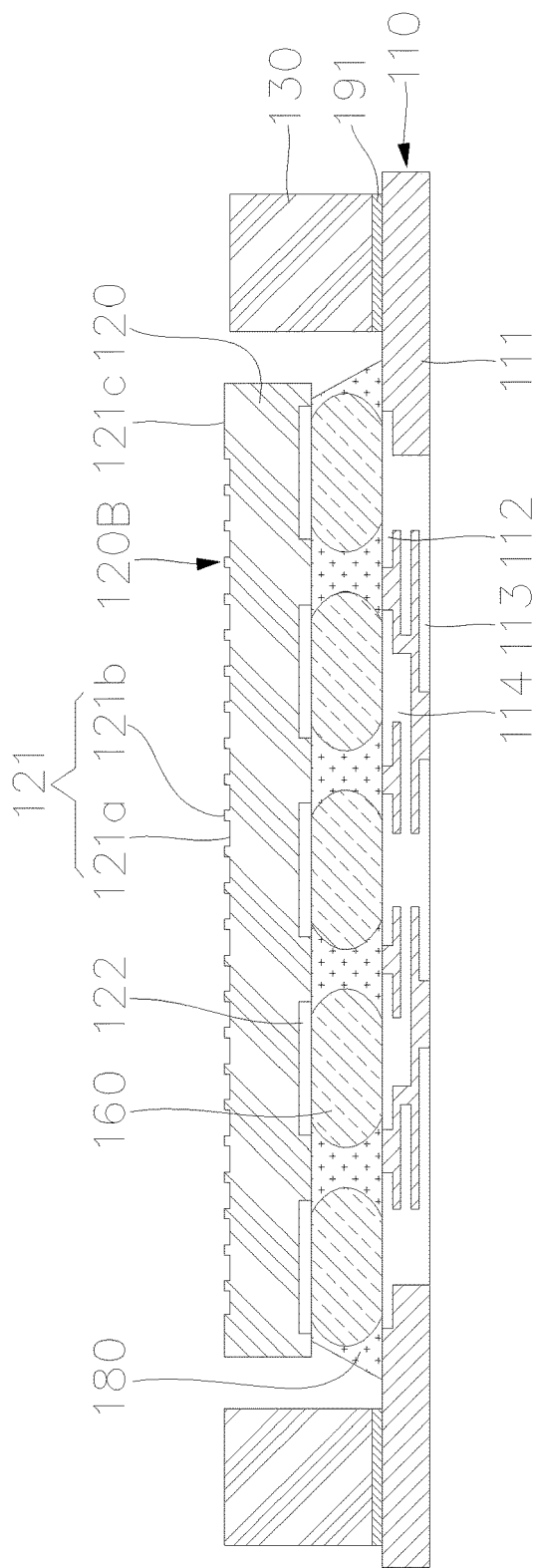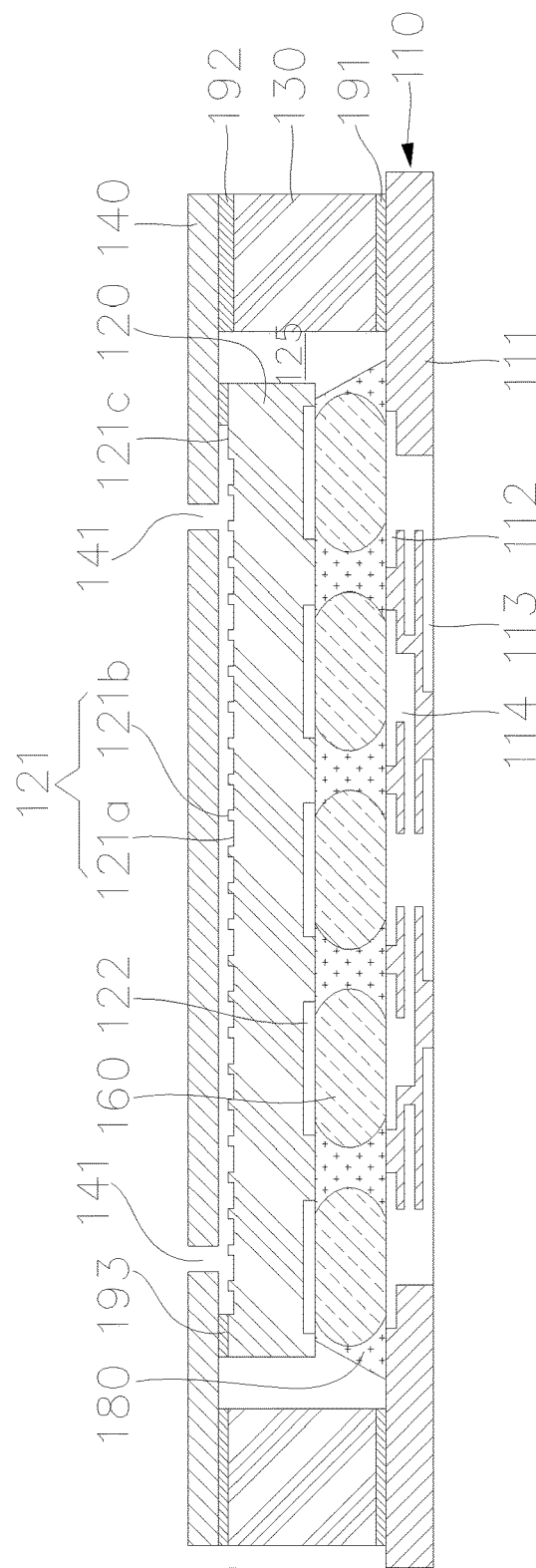

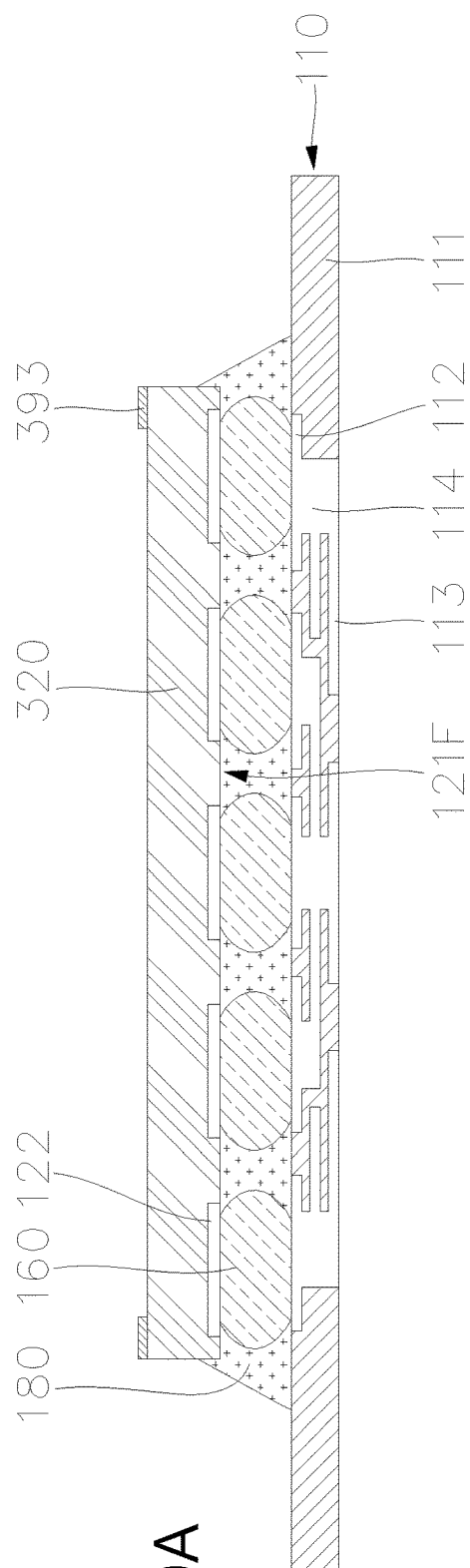
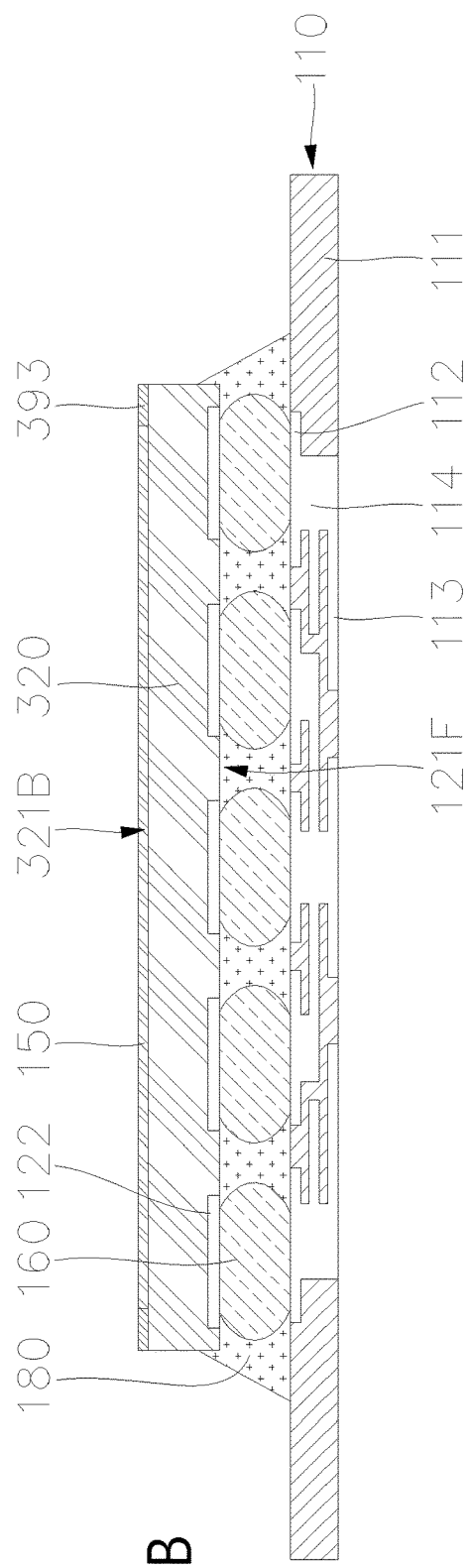
FIG. 10A
FIG. 10B

SEMICONDUCTOR DEVICE HAVING A LID WITH THROUGH-HOLES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 5A to 5J show an example method for manufacturing an example electronic device.

FIGS. 6A to 6F show an example method for manufacturing an example semiconductor device.

FIGS. 10A to 10C show an example method for manufacturing an example semiconductor device.

Figure 1:
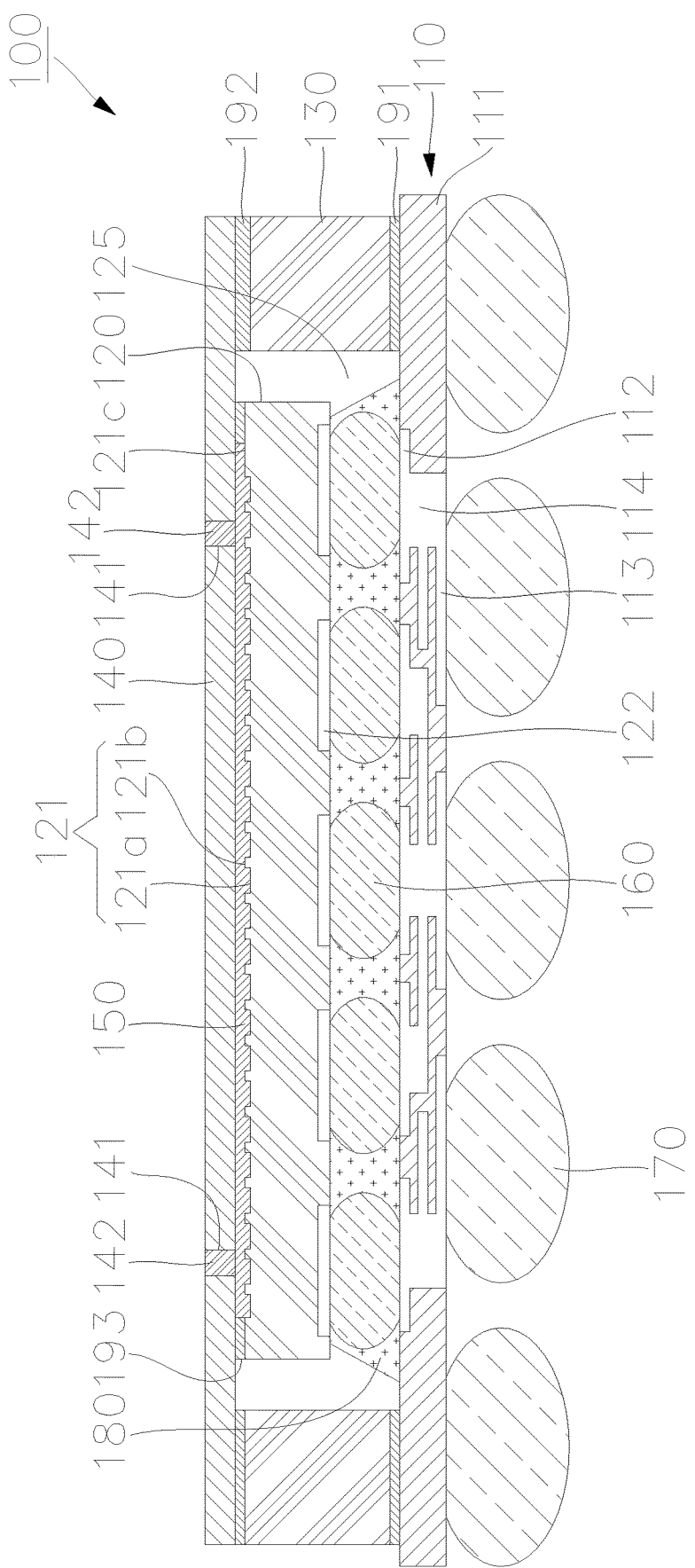
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}. The terms "comprises," "comprising," "includes," and/or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements. Geometrical descriptive terms, such as coplanar, planar, perpendicular, vertical, horizontal, among others, encompass not only such exact terms, but also substantial approximations of such terms, for example, within manufacturing tolerances

DESCRIPTION

In one example, a semiconductor device comprises a substrate having a top side and a conductor on the top side of the substrate, an electronic device on the top side of the substrate connected to the conductor on the top side of the substrate via an internal interconnect, a lid covering a top side of the electronic device, and a thermal material between the top side of the electronic device and the lid, wherein the lid has a through-hole.

In another example, a method to manufacture a semiconductor device comprises providing patternings on a backside of an electronic device, placing the electronic device on a top side of a substrate, wherein the electronic device contacts a conductor on the top side of the substrate, providing a lid over the electronic device, injecting a thermal material into a through-hole of the lid, and filling the through-hole to seal the thermal material between the lid and the top side of the electronic device.

In a further example, a semiconductor structure comprises a substrate having a top side and a conductor on the top side of the substrate, an electronic device on the top side of the substrate connected to the conductor on the top side of the substrate via an internal interconnect, wherein the electronic device has patternings on a top side of the electronic device, an encapsulant on the top side of the substrate adjacent to the electronic device, a lid covering the top side of the electronic device, and a thermal material between the top side of the electronic device and the lid.

Other examples are included in the present disclosure. Such examples may be found in the figures, in the claims, and/or in the description of the present disclosure.

FIG. 1 shows a cross-sectional view of an example semiconductor device 100. In the example shown in FIG. 1, semiconductor device 100 can comprise substrate 110, electronic device 120, perimeter structure 130, lid 140, thermal material 150, internal interconnects 160 and external interconnects 170. In some examples, semiconductor device 100 can further comprise underfill 180.

Substrate 110 can include dielectric structure 111, wiring patterns 112 and 113, and conductive path 114. In some examples, a wiring pattern can be referred to as a conductor which may or may not necessarily be arranged in any specific layout, design, or pattern. Electronic device 120 can be on the top side of substrate 110 and can comprise one or more features or patternings 121 having valleys 121a and crests 121b, and dam 121c, which are formed on a backside (or top surface). A surface also be referred to herein as a side, and the scope of the disclosed subject matter is not limited in this respect. As used herein, formed can also mean provided, and the scope of the disclosed subject matter is not limited in this respect. In addition, electronic device 120 can comprise terminals 122 formed on a front side (or bottom surface). Perimeter structure 130 can be formed on a top portion of substrate 110, corresponding to the outer periphery of electronic device 120. Lid 140 can be attached to electronic device 120 and perimeter structure 130. In some embodiments, lid 140 can at least partially cover a top side of electronic device 120. Lid 140 can comprise through-holes 141 provided for injecting thermal material 150, venting air, or overflowing thermal material 150, and plugs 142 plugging through-holes 141. Thermal material 150 can be injected between electronic device 120 and lid 140. The thermal material 150 can be between the top side of electronic device 120 and lid 140. Internal interconnects 160 can electrically connect electronic device 120 to substrate 110. External interconnects 170 can electrically connect semiconductor device 100 to an external device. Electronic device 120 can connect to a conductor or wiring patterns 112 on the top side of substrate 110 via one or more internal interconnects 160. In some examples, underfill 180 can be interposed between electronic device 120 and substrate 110.

In addition, in some examples, semiconductor device 100 can comprise adhesive 191 for connecting substrate 110 and perimeter structure 130 to each other, adhesive 192 for connecting perimeter structure 130 and lid 140 to each other, and adhesive 193 for connecting lid 140 and electronic device 120 to each other.

In addition, in some examples, gaps or spaces 125 can exist between electronic device 120 and perimeter structure 130. In some cases, gaps 125 can be filled with an encapsulant.

Substrate 110, perimeter structure 130, lid 140, thermal material 150, internal interconnects 160, and external interconnects 170 can be referred to as a semiconductor package. The semiconductor package can provide protection for electronic device 120 from external elements and/or environmental exposure. In some examples, the semiconductor package can provide electrical couplings between an external electrical device and external interconnects 170.

Figure 2A:
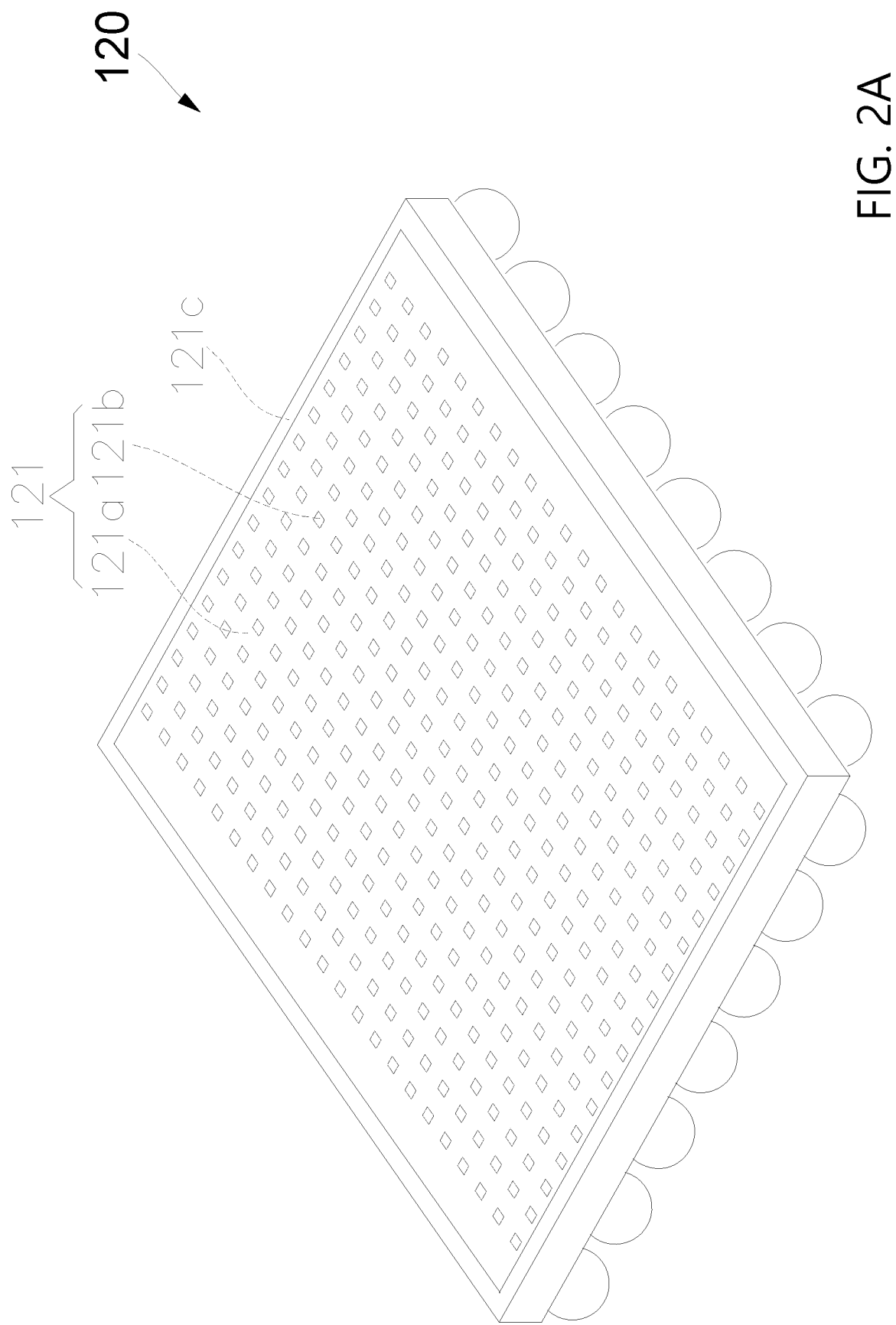
FIGS. 2A and 2B show perspective views of example semiconductor devices.
Figure 2B:
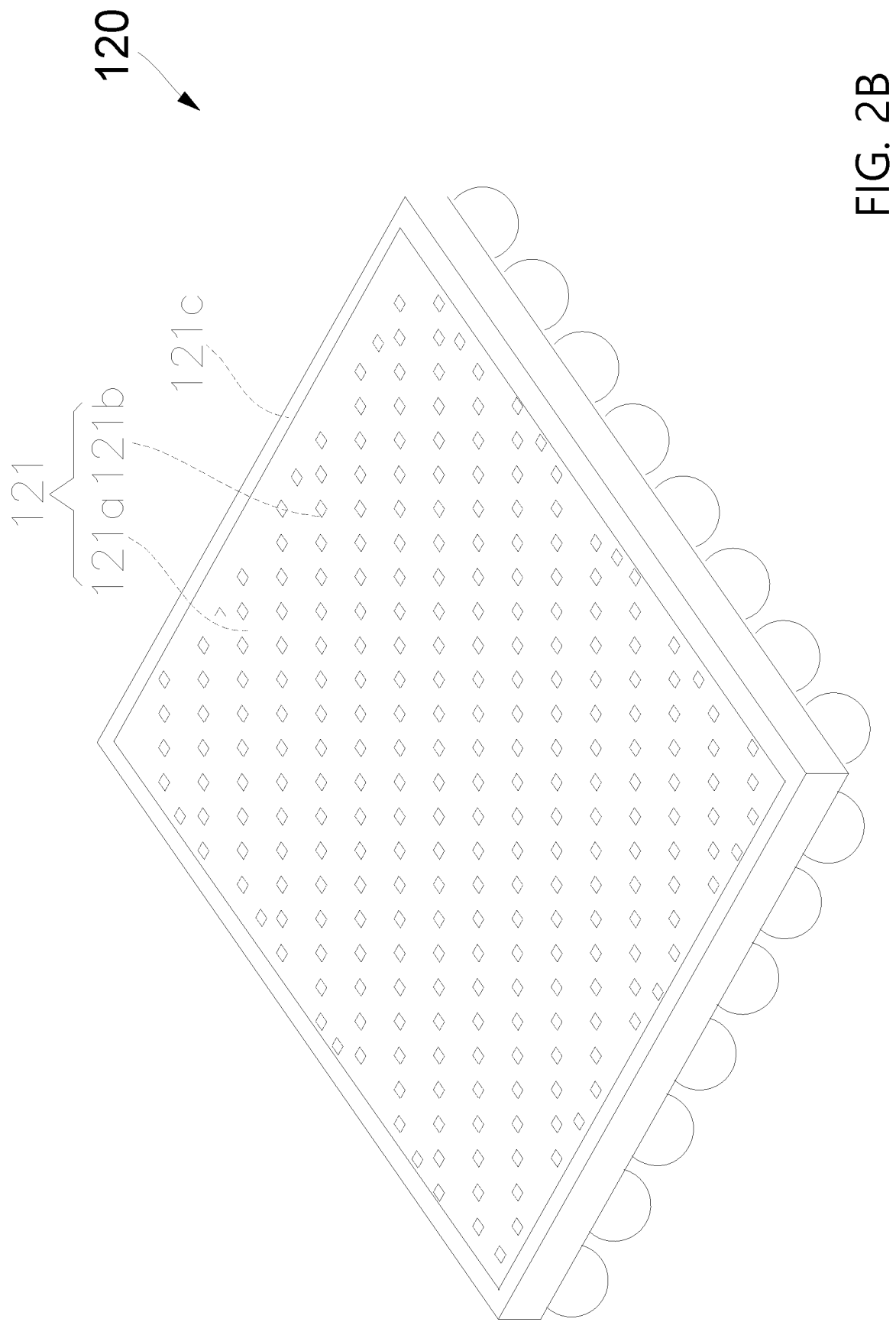

FIGS. 2A and 2B show perspective views of example electronic devices 120. In the examples shown in FIGS. 2A and 2B, patternings 121 formed in electronic device 120 can be arrayed throughout the backside (or top surface) of electronic device 120. As shown in FIG. 2A, patternings 121 can be provided or arrayed regularly and/or irregularly parallel with one side of electronic device 120. Alternatively, as shown in FIG. 2B, patternings 121 can be provided or arrayed regularly and/or irregularly throughout the backside (or top surface) of electronic device 120, and/or in a diagonal direction. Patternings 121 can also be arrayed in a zig-zag pattern. Patternings 121 can comprise a zig-zag pattern or other arrangement to distribute the thermal material across electronic device 120 when thermal material 150 is introduced into patternings 121 via through-holes 141 before through-holes 141 are filled or plugged.

Figure 3A:
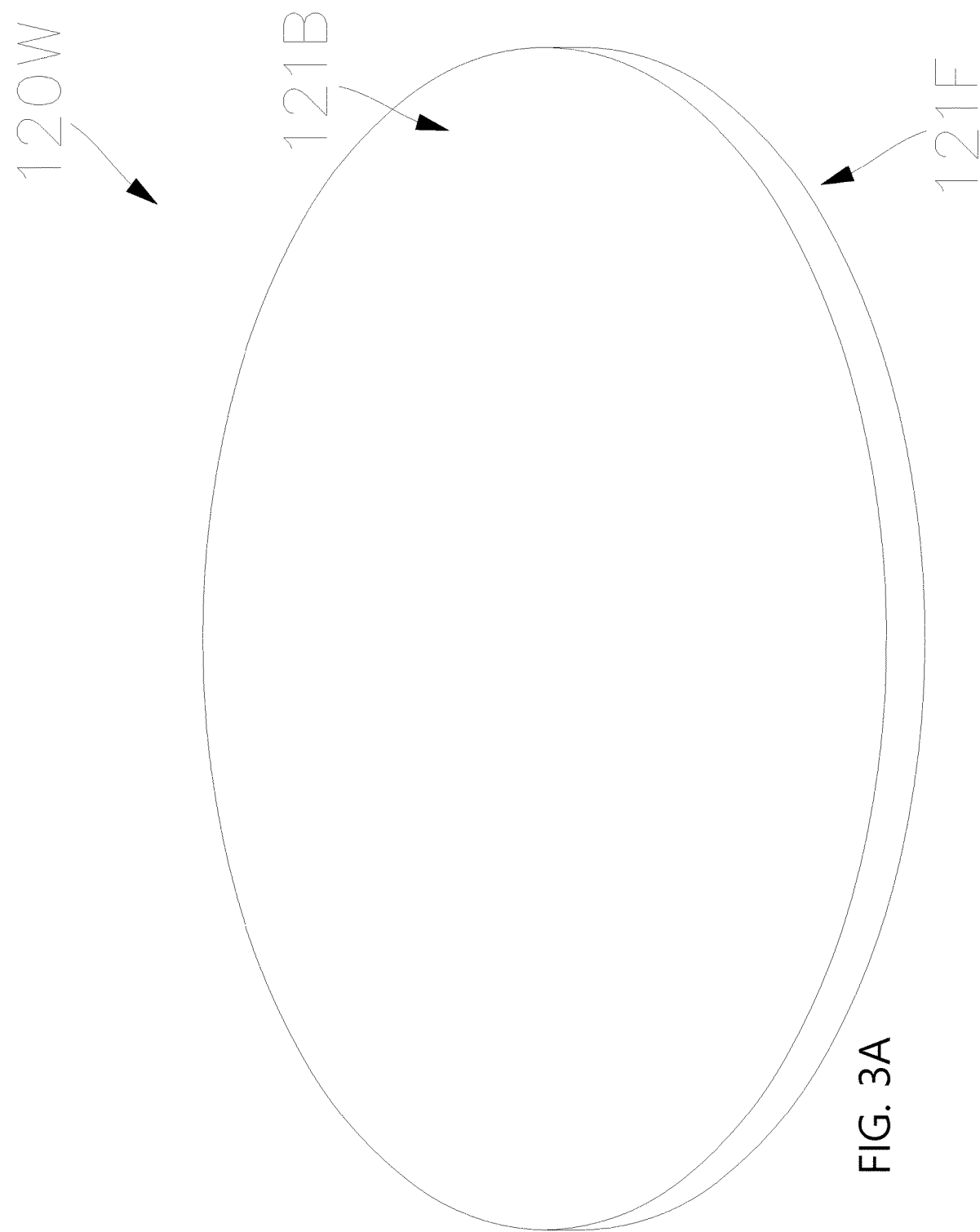
FIGS. 3A to 3C show an example method for manufacturing an example wafer having a plurality of electronic devices.
Figure 3B:
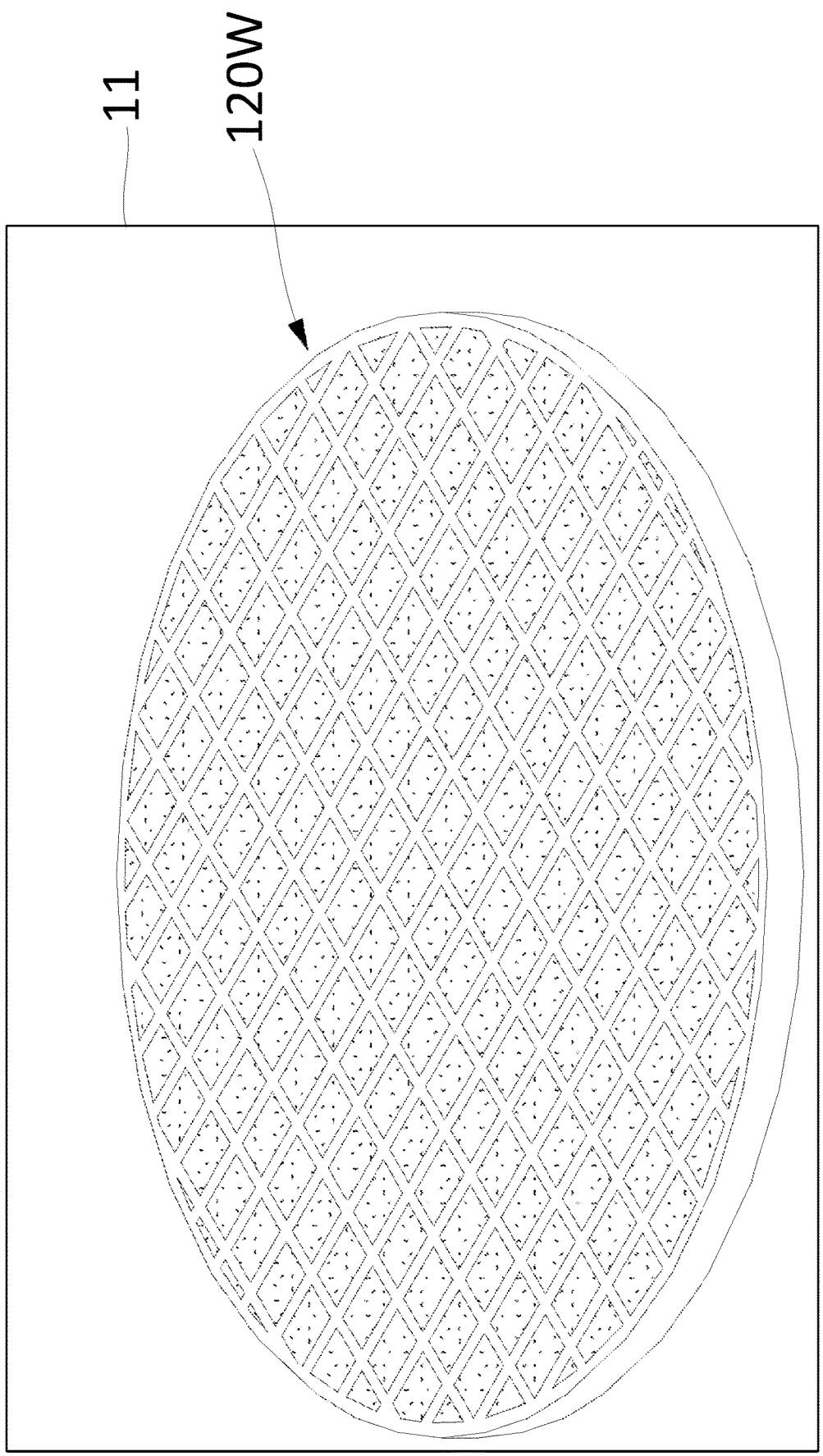
Figure 3C:
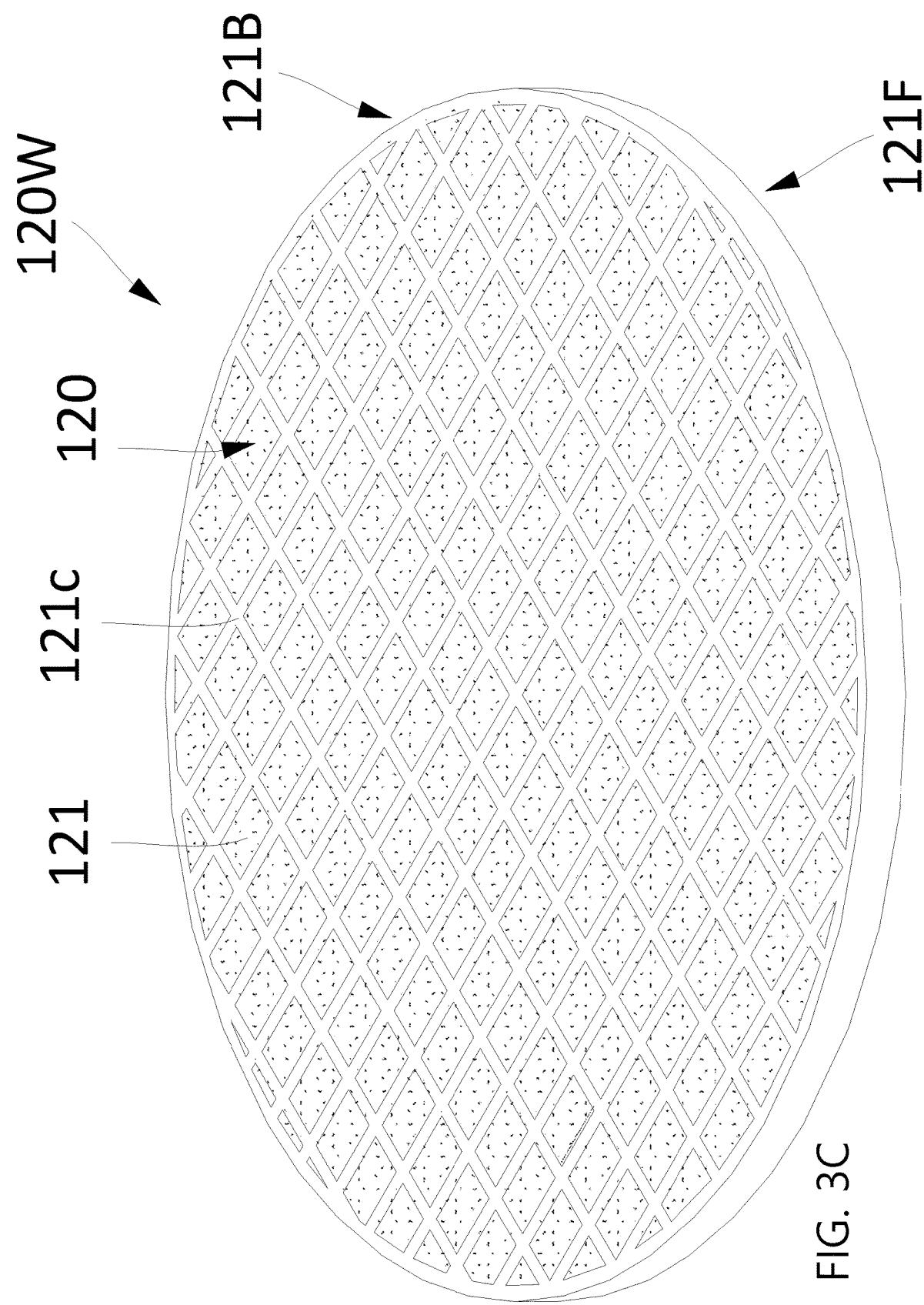

FIGS. 3A to 3C show an example method for manufacturing an example wafer 120W having a plurality of electronic devices 120. FIG. 3A shows a perspective view of a wafer 120W at an early stage of manufacture. In the example shown in FIG. 3A, wafer 120W can be substantially in a planar circular disk shape. Wafer 120W can comprise a semiconductor wafer, such as a silicon wafer, in which several electronic devices 120 have been formed through a semiconductor manufacturing process. Wafer 120W can comprise substantially planar backside 121B (or top surface) and substantially planar front side 121F (or bottom surface) opposite to the backside 121B. Here, backside 121B can be referred to as a non-active surface, and front side 121F can be referred to as an active surface. In addition, integrated circuits can be formed on the front side 121F (or active surface) of wafer 120W and backside 121B can remain free of integrated circuitry. In addition, several tens to several thousands of electronic devices 120 can be arrayed on wafer 120W in a checkerboard shape and can be separated into a plurality of unitary electronic devices 120 by sawing wafer 120W along a scribe line during the manufacture of semiconductor device 100.

FIGS. 3B-3C show a perspective view of wafer 120W at a later stage of manufacture. In the example shown in FIG. 3B, wafer 120W can be positioned in a plasma chamber 11 and subjected to plasma etching. FIG. 3C shows wafer 120W after removal from plasma chamber 11. In some examples, a lower protection coating that is not subjected to plasma etching can be formed on the front side 121F of wafer 120W, and the backside 121B of wafer 120W can be exposed to a plasma atmosphere. Therefore, the overall backside 121B of wafer 120W can be plasma-etched, providing patternings 121 having coarse surface roughness.

In addition, backside 121B of wafer 120W can be formed in various types by patterning an upper protection coating (e.g., photoresist). In some examples, the upper protection coating can be formed in various patterns including, but not limited to, lattice patterns, line patterns, trench patterns, dot patterns, or equivalents. Accordingly, backside 121B of wafer 120W can be exposed in lattice patterns, line patterns, trench patterns, dot patterns, or equivalents. Accordingly, after plasma etching, patternings 121 having lattice patterns, line patterns, trench patterns, dot patterns, or equivalents can be formed on backside 121B of wafer 120W. There can be examples where patternings 121 and dam 121c can be formed in other ways, such as by chemical or wet etching. In some examples, however, a region of the backside 121B in wafer 120W, corresponding to the scribe line (e.g., boundary area between electronic devices 120), can be coated with the upper protection coating (by not being exposed, for example), dam 121c can be formed at a region corresponding to the scribe line without being etched during the plasma etching. In some examples, the plasma etching can be performed through at least one selected from the group consisting of, but not limited to, Reactive Ion Etching (RIE), Magnetically-Enhanced RIE (MERIE), Electron Cyclotron Resonance (ECR), Transformer Coupled Plasma (TCP), Inductively Coupled Plasma (ICP), Helical Plasma, Helicon Plasma, High Density Plasma (HDP), or equivalents.

In some examples, patternings 121 can be formed by electroless etching, instead of the plasma etching. For example, a lower protection layer can be formed on the front side 121F of wafer 120W, an upper protection layer (corresponding to the scribe line) can be formed on the backside 121B of wafer 120W in a checkerboard line shape, and wafer 120W can then be immersed in a mixed solution of a silver nitrate (AgNO3) solution and a hydrofluoric acid (HF) solution. In this way, a large number of silver (Ag) particles can be physically coupled and sprinkled or scattered to backside 121B and the upper protection layer of wafer 120W. Here, the silver nitrate (AgNO3) solution can be in a concentration ranging from approximately 5 millimolar (mM) to approximately 15 mM, and the hydrofluoric acid (HF) solution can be in a concentration ranging from approximately 2 mM to approximately 8 mM. In addition, the quantity of Ag particles coupled and sprinkled or scattered to the backside 121B of wafer 120W can be appropriately adjusted by appropriately adjusting the concentrations of the solutions and the immersion time of wafer 120W.

Next, patternings 121 can be formed on the backside 121B of wafer 120W by immersing the wafer 120W including Ag particles coupled and sprinkled or scattered to backside 121B of wafer 120W in a mixed solution of a hydrogen peroxide (H2O2) solution and a hydrofluoric acid (HF) solution. In some examples, patternings 121 having valleys and crests can be formed. Here, since the Ag particles are unevenly coupled and sprinkled or scattered to backside 121B of wafer 120W, patternings 121 can also be formed in a non-uniform shape. Further, it is natural for the upper protection layer not to react with the mixed solution of hydrogen peroxide (H2O2) solution and hydrofluoric acid (HF) solution.

In addition, the hydrogen peroxide (H2O2) solution and the hydrofluoric acid (HF) solution can have concentrations ranging from approximately 2 mM to approximately 8 mM, respectively. In addition, the immersion time can be in the range from approximately 1 minute to approximately 12 minutes. For example, when wafer 120W is immersed in the mixed solution for approximately 2 minutes, patternings 121 shaped of approximately 2.5 micrometers (μm) long can be formed. When wafer 120W is immersed in the mixed solution for approximately 6 minutes, patternings 121 shaped of approximately 5 μm long can be formed. When wafer 120W is immersed in the mixed solution for approximately 10 minutes, patternings 121 shaped of approximately 7.5 μm long can be formed.

As described above, etching is rapidly performed at contact regions of Ag particles and wafer 120W. It is understood that the etching solution facilitates occurrence of oxidations at Ag and Si interfaces. Meanwhile, Ag particles remain in valleys of patternings 121 due to this phenomenon. The Ag particles remaining in valleys of patternings 121 can be removed for the purpose of suppressing leakage current.

Alternatively, patternings 121 can be formed by a laser process. In some examples, CO2 lasers, fiber lasers, disk lasers, semiconductor lasers, or Yttrium Aluminum Garnet (YAG) lasers can be used for providing patternings 121 on backside 121B of wafer 120W. In some examples, an intensity, time, and/or path of the laser beam can be adjusted so that patternings 121 of a desired shape can be formed.

Figure 4A:
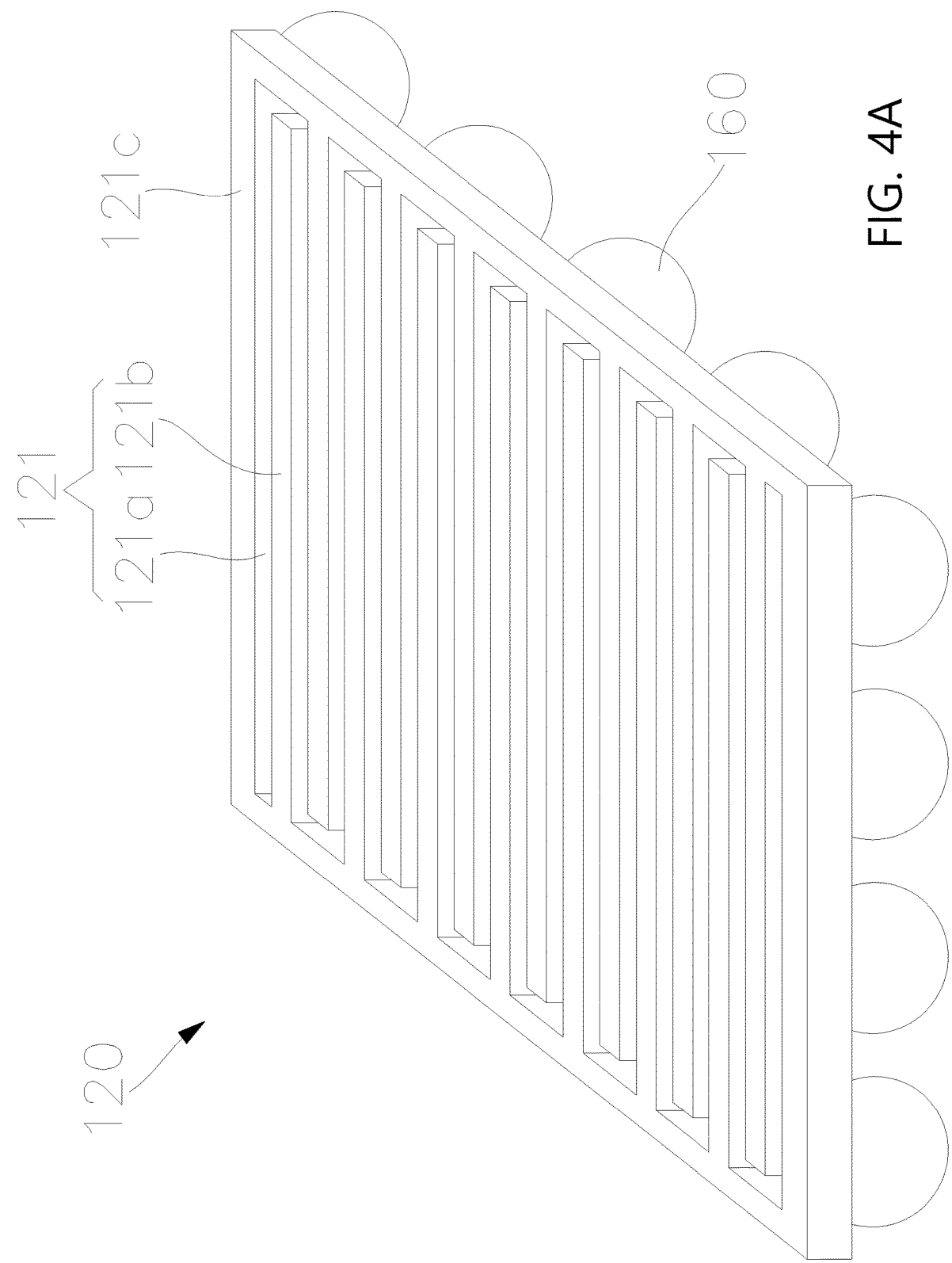
FIGS. 4A and 4B show a perspective view and a cross-sectional view of an example electronic device.
Figure 4B:
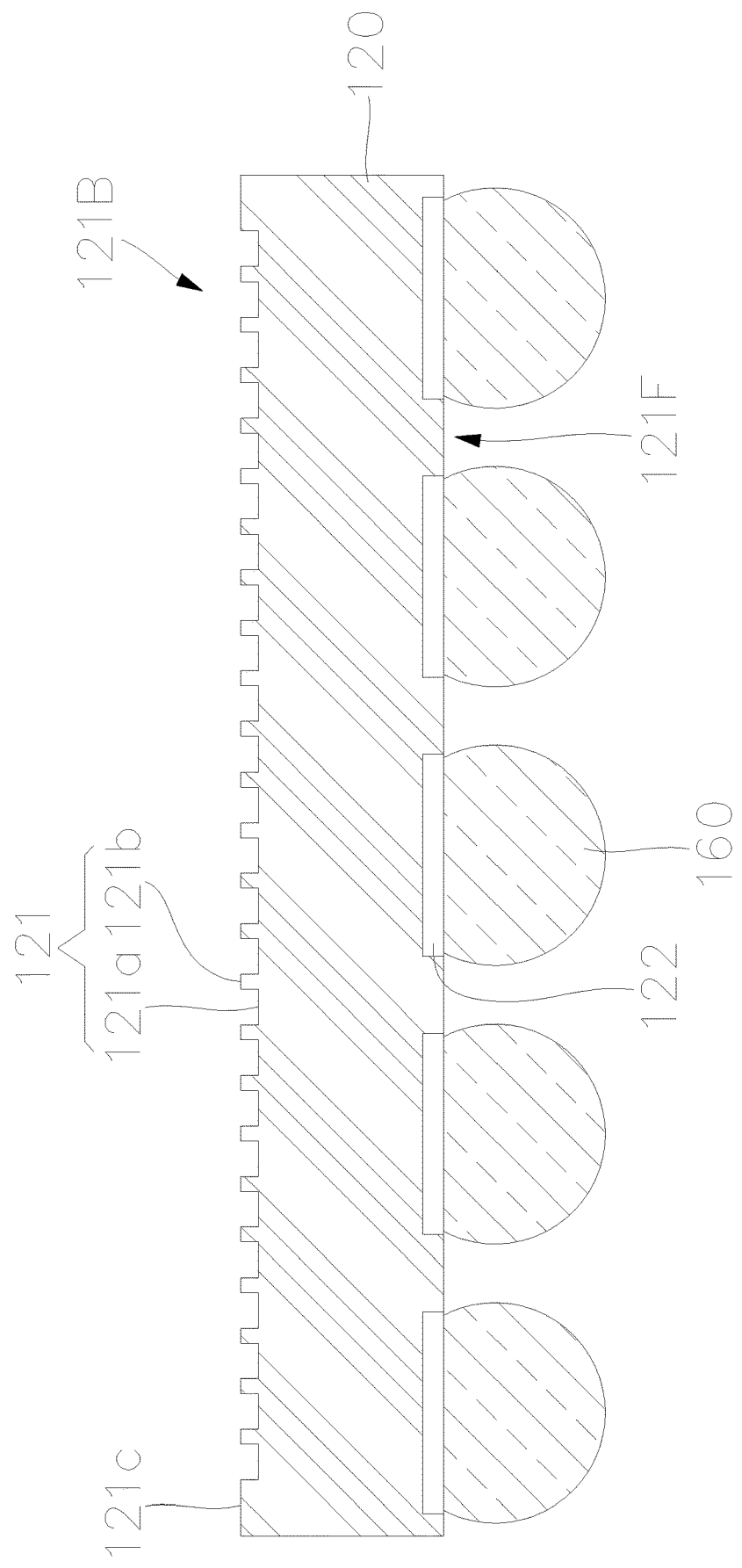

FIGS. 4A and 4B show a perspective view and a cross-sectional view of an example electronic device 120. In examples shown in FIGS. 4A and 4B, electronic device 120 can include backside 121B (or a top surface) and front side 121F (or a bottom surface) opposite to backside 121B. In addition, electronic device 120 can be singulated from wafer 120W along streets, yielding a plurality of unitary electronic devices.

Here, electronic device 120 can have a thickness in the range from approximately 100 μm to approximately 1,000 μm. In some examples, electronic device 120 can be referred to as a semiconductor die or a semiconductor chip. In some examples, electronic device 120 can perform functions of a logic die, a micro control unit, a memory, a digital signal processor, a network processor, a power management unit, an audio processor, a radio-frequency (RF) circuit, a wireless baseband system on-chip processor, an application specific integrated circuit, etc.

Electronic device 120 can include patternings 121 having lattice patterns, line patterns, trench patterns, and/or dot patterns provided or formed on backside 121B of an electronic device 120 of wafer 120W, and dam 121c can be formed along the periphery of patternings 121. In some examples, dam 121c can be an unetched region of backside 121B and can be formed along the rectangular periphery of electronic device 120. Patternings 121 having stripe patterns, line patterns, trench patterns, zig-zag patterns, or meander patterns are shown in FIG. 4A and FIG. 4B. In some examples, patternings 121 can have depths, widths and/or spaces in the range from approximately 1 μm to approximately 100 μm. In addition, the width of dam 121c can be greater than the widths of patternings 121. In some examples, dam 121c can have a width in the range from approximately 10 μm to approximately 1 mm.

In addition, electronic device 120 can comprise terminals 122 formed on front side 121F and internal interconnects 160 connected to terminals 122. In some examples, terminals 122 can be referred to conductive pads, die pads, or bond pads. Terminals 122 can include aluminum (Al), an aluminum (Al) alloy, copper (Cu), a copper (Cu) alloy, nickel (Ni), a nickel (Ni) alloy, gold (Au), a gold (Au) alloy, silver (Ag), a silver (Ag) alloy, palladium (Pd), a palladium (Pd) alloy, platinum (Pt), or a platinum (Pt) alloy. In addition, in some examples, internal interconnects 160 can comprise or be referred to as conductive posts, conductive pillars, conductive bumps, solder bumps, solder balls, solder-coated conductive balls, conductive posts having solder caps, or conductive pillars having solder caps. Internal interconnects 160 can comprise aluminum (Al), an aluminum (Al) alloy, copper (Cu), a copper (Cu) alloy, nickel (Ni), a nickel (Ni) alloy, gold (Au), a gold (Au) alloy, silver (Ag), a silver (Ag) alloy, palladium (Pd), a palladium (Pd) alloy, platinum (Pt), or a platinum (Pt) alloy.

Figure 5C:
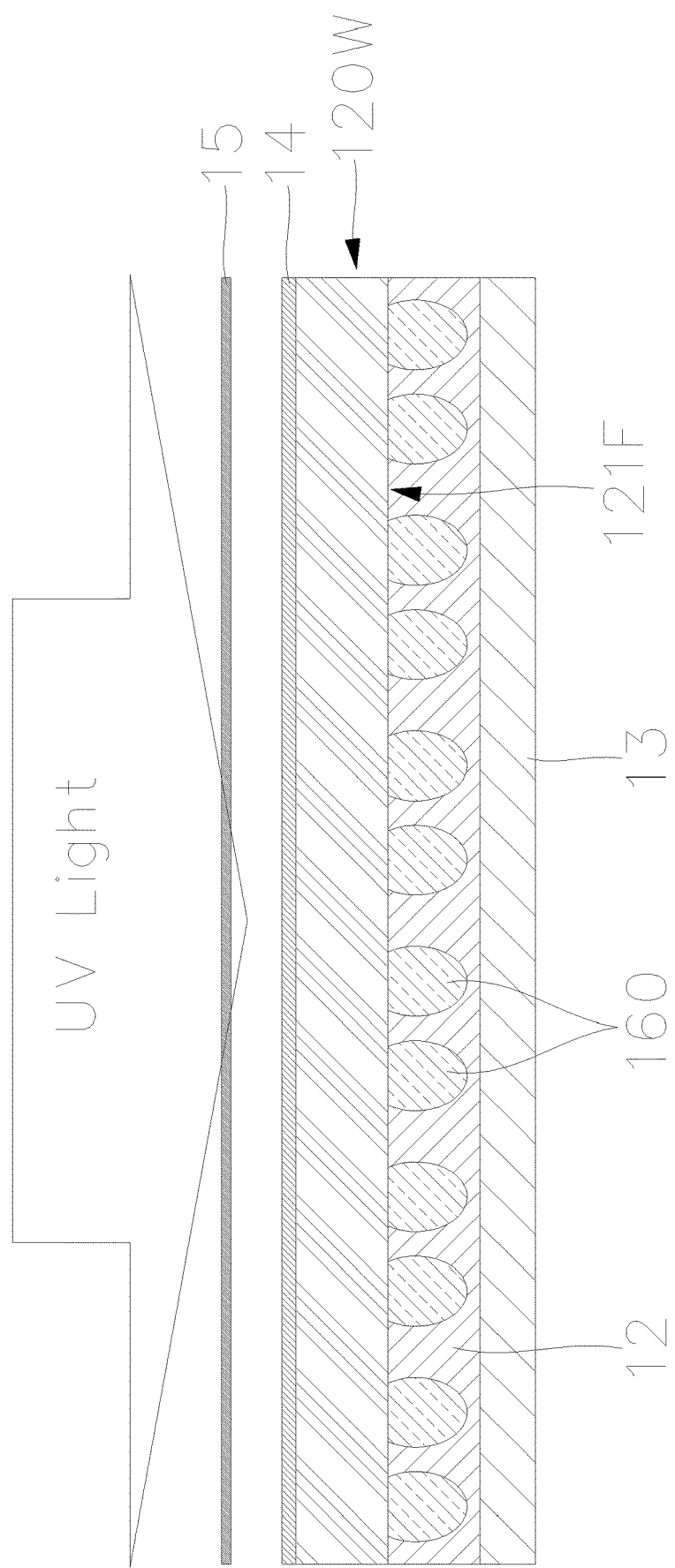

FIGS. 5A to 5J show an example method for manufacturing an example electronic device 120. FIG. 5A shows a cross-sectional view of wafer 120W at an initial stage of manufacture. In the example shown in FIG. 5A, temporary adhesive 12 (or front side protection layer) can be adhered to front side 121F of wafer 120W having internal interconnects 160. Accordingly, front side 121F of wafer 120W and internal interconnects 160 can be completely covered by temporary adhesive 12. In addition, wafer support system 13 can be mounted on temporary adhesive 12. Backside 121B of wafer 120W, where integrated circuits are not formed, can remain exposed. In addition, exposed backside 121B of wafer 120W can be cleaned using deionized water or alcohol.

FIG. 5B shows a cross-sectional view of wafer 120W at a later stage of manufacture. In the example shown in FIG. 5B, photoresist 14 can be coated on the backside 121B of wafer 120W. In some examples, photoresist 14 can be coated using one or more of spin coating, dip coating, or spray coating. After the coating, the photoresist 14 having a high viscosity can be soft-baked to lower the viscosity.

FIG. 5C shows a cross-sectional view of wafer 120W at a later stage of manufacture. In the example shown in FIG. 5C, mask 15 is positioned and aligned on photoresist 14, and ultraviolet (UV) beams can be irradiated into mask 15. Here, mask 15 can have lattice patterns, stripe patterns, and/or dot patterns, which can be transferred to photoresist 14 by UV irradiation. The patterns can substantially correspond to shapes of patternings 121 that will be formed on backside 121B of wafer 120W.

Figure 5D:
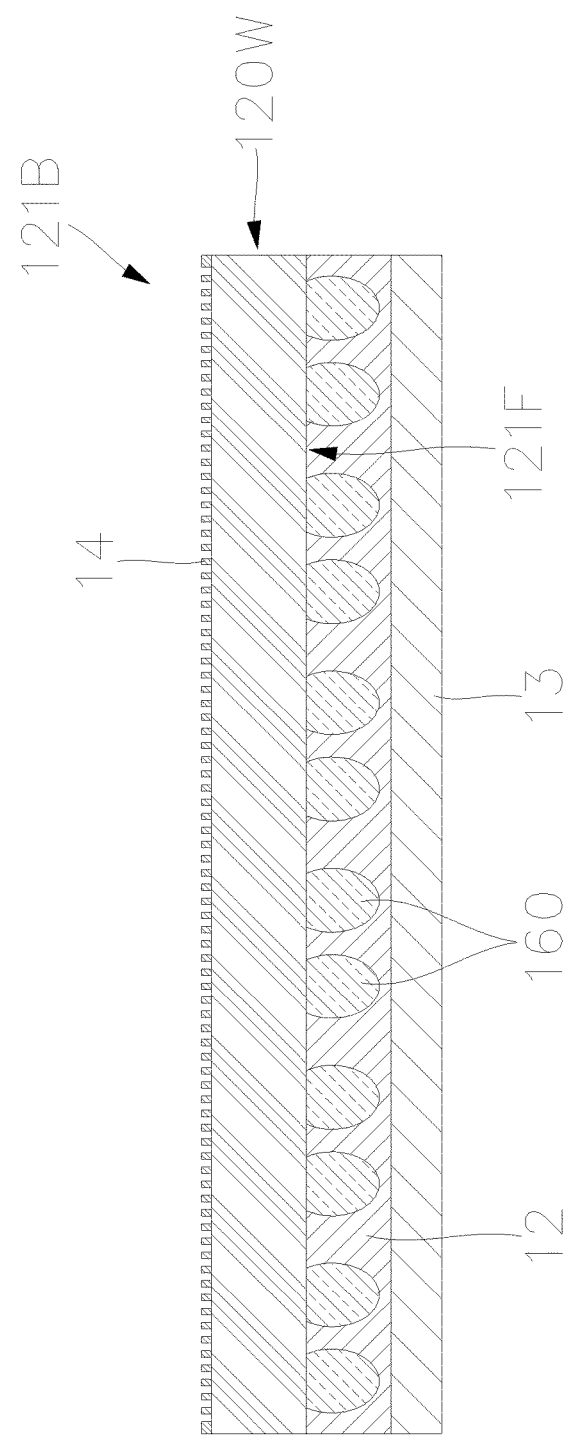

FIG. 5D shows a cross-sectional view of wafer 120W at a later stage of manufacture. In the example shown in FIG. 5D, photoresist 14 having the transferred patterns of mask 15 can be subjected to a post-exposure bake (PEB) process to then be developed. Here, after the developing, photoresist 14 can be hard baked. In addition, after the hard baking, a development-inspection process can further be performed.

Figure 5E:
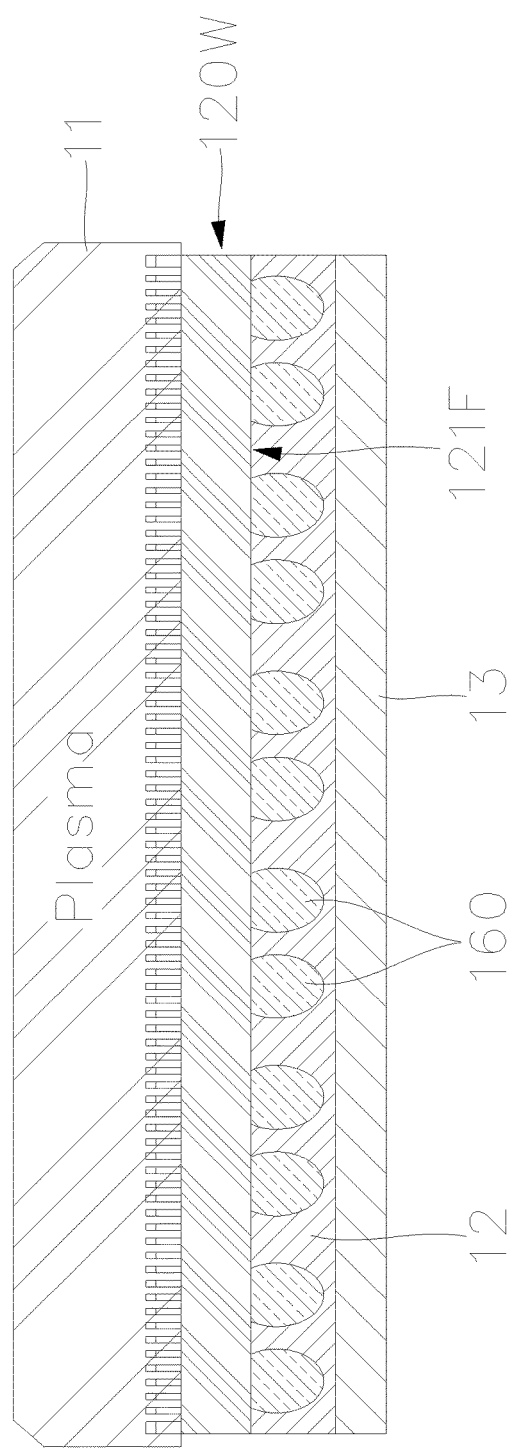

FIG. 5E shows a cross-sectional view of wafer 120W at a later stage of manufacture. In the example shown in FIG. 5E, wafer 120W can be placed into a plasma etching chamber 11 to partially etch backside 121B of wafer 120W. In some examples, plasma etching gas can etch a predetermined region of the backside 121B of wafer 120W exposed through photoresist 14, and patternings 121 having shapes corresponding to the patterns of photoresist 14 can be formed on backside 121B of wafer 120W.

Figure 5F:
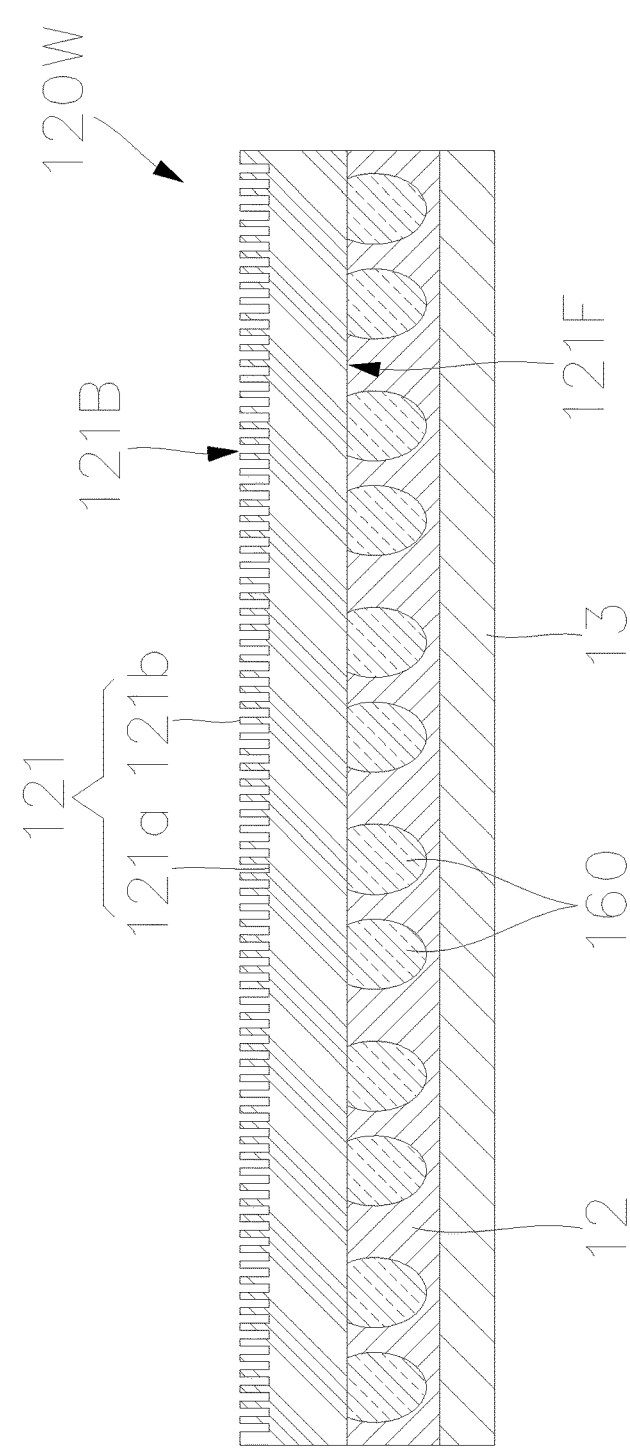

FIG. 5F shows a cross-sectional view of wafer 120W at a later stage of manufacture. In the example shown in FIG. 5F, patterned photoresist 14 can be removed from backside 121B of wafer 120W using a plasma striping and/or a sand blast process. In addition, residues remaining on backside 121B of wafer 120W (e.g., scum) can also be removed by plasma cleaning. As the result of the stripping and/or descum process, patternings 121 formed on backside 121B of wafer 120W can be exposed. Thereafter, wafer support system 13 can be separated from temporary adhesive 12 and temporary adhesive 12 can then be removed from front side 121F of wafer 120W and internal interconnects 160. In this way, front side 121F of wafer 120W and internal interconnects 160 can be exposed.

Figure 5G:
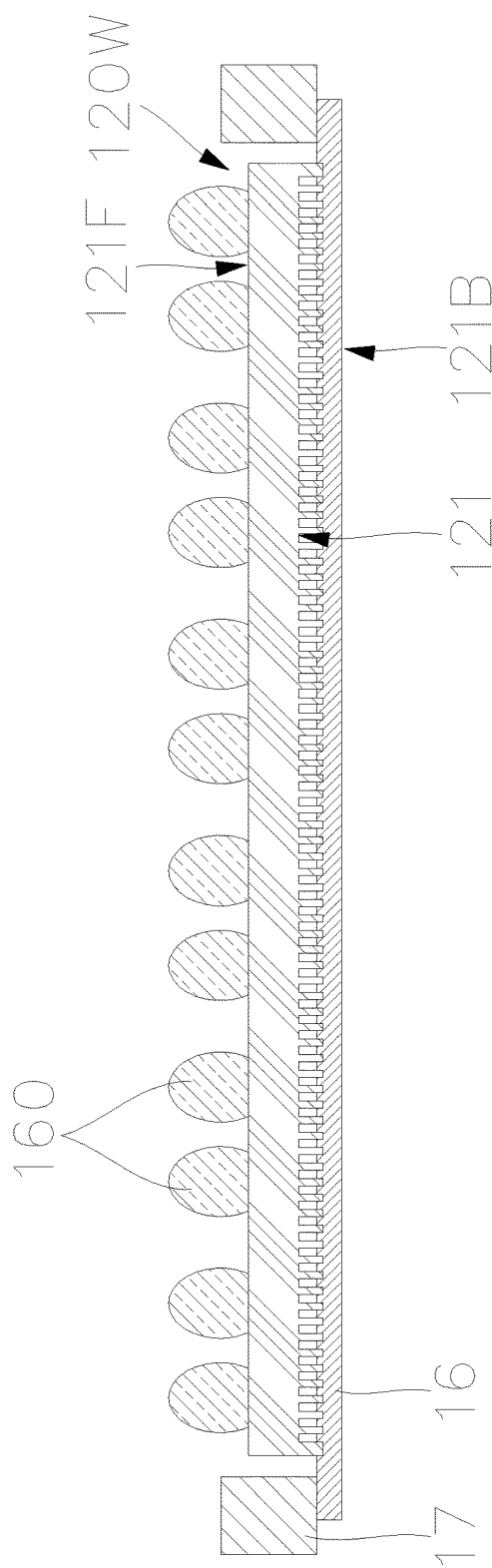

FIG. 5G shows a cross-sectional view of wafer 120W at a later stage of manufacture. In the example shown in FIG. 5G, backside 121B of wafer 120W (e.g., the surface having patternings 121) can be attached onto temporary tape 16. Here, temporary tape 16 can be attached to support ring 17. Accordingly, wafer 120W can be put into singulation equipment in a state in which it is attached to temporary tape 16 and support ring 17.

Figure 5H:
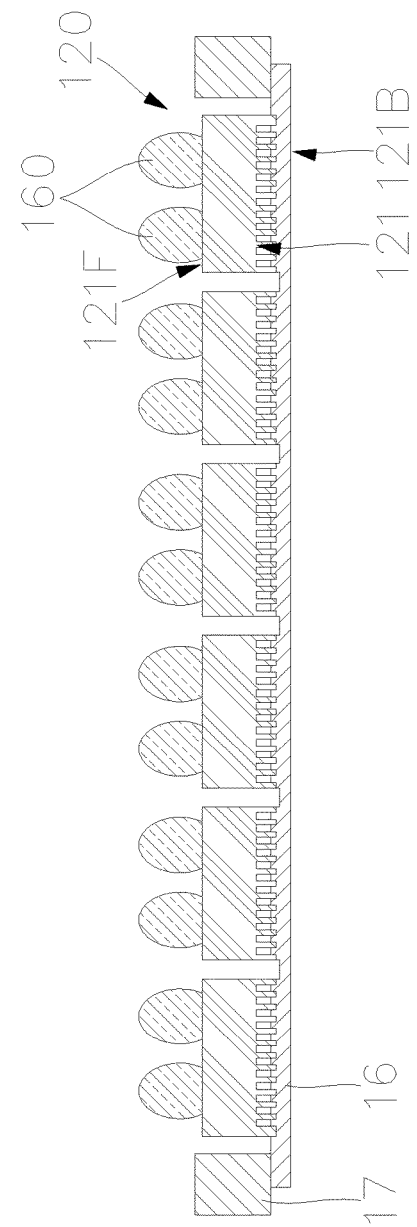

FIG. 5H shows a cross-sectional view of wafer 120W at a later stage of manufacture. In the example shown in FIG. 5H, wafer 120W can be separated into unitary electronic devices 120 by allowing a blade or laser beam to penetrate along the scribe line of wafer 120W.

Figure 5I:
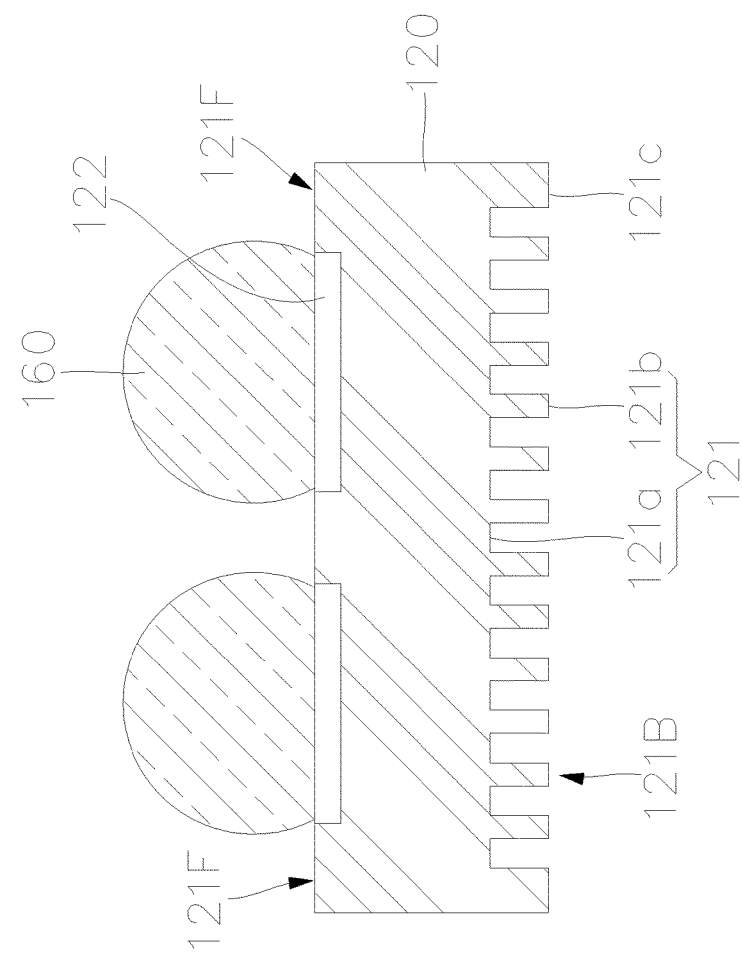

FIG. 5I shows a cross-sectional view of electronic device 120 at a later stage of manufacture. In the example shown in FIG. 5I, unitary electronic devices 120 can be separated from temporary tape 16 attached to support ring 17. Good electronic devices 120 can be sorted by performing an inspection process on the separated unitary electronic devices 120 to then be housed in separate trays. Here, good can refer to a device that is operable and/or meets design specifications within an acceptable tolerance, and a device that is not considered good is unusable and/or discarded, although the scope of the disclosed subject matter is not limited in this respect. The good electronic devices 120 can be supplied to substrate 110 by a pick-and-place tool during an assembling process of semiconductor device 100.

Figure 5J:
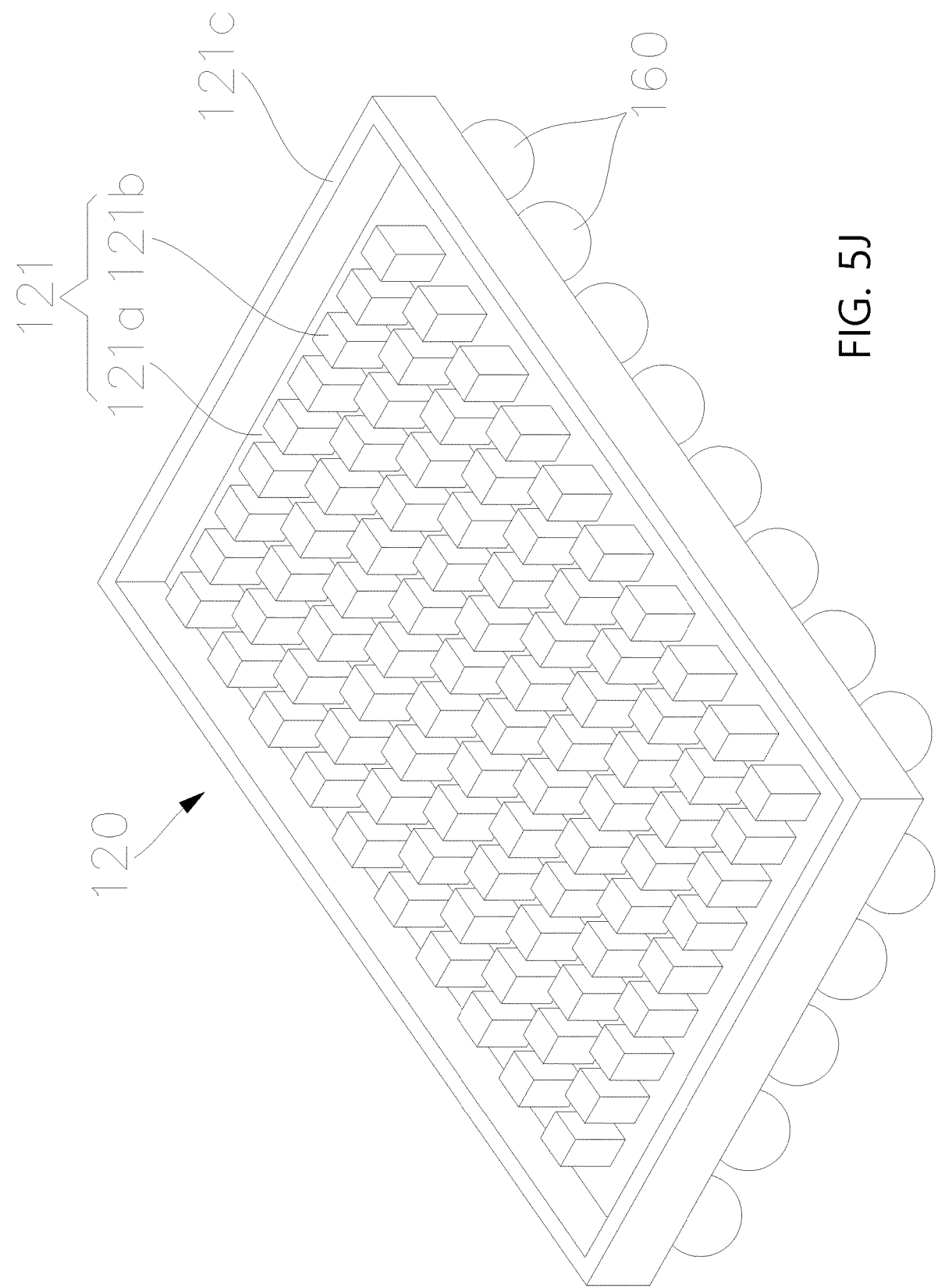

FIG. 5J shows a perspective view of an exemplary electronic device 120 at a later stage of manufacture. In the example shown in FIG. 5J, electronic device 120 can comprise multiple patternings 121 formed on backside 121B and dam 121c formed along the periphery of patternings 121. In some examples, patternings 121 can comprise valleys 121a and crests 121b. In some examples, patternings 121 can be shaped of trigonal prisms, rectangular prisms, pentagonal prisms, hexagonal prisms, pillars, or cylinders, or pillars or cylinders with domes or partial domes, cones or partial cones or frustums at one end, for example a silo shape. In some examples, patternings 121 can be shaped of trigonal prisms, rectangular pyramids, pentagonal pyramids, hexagonal pyramids, frustums, or cones. In addition, in some examples, dam 121c can be shaped of a rectangle or square. In some examples, patternings 121 can correspond to those illustrated in previous figures, such as the stripe patterns, line patterns, trench patterns, zig-zag patterns, or meander patterns described with respect to FIG. 4A. In some examples, dam 121c can have a top surface substantially coplanar with top surfaces of crests 121b. FIG. 5J shows that valleys 121a and crests 121b of patternings 121 are regularly arranged, but aspects of the present disclosure are not limited thereto. Alternatively, valleys 121a and crests 121b of patternings 121 can be irregularly arranged. In addition, FIG. 5J shows that the crests 121b of patternings 121 have the same height, but they can have different heights. In some examples, the height and/or width of crests 121b can range from approximately 1 μm to approximately 100 μm, and the width and/or depth of valleys 121a can range from approximately 1 μm to approximately 100 μm. Patternings 121 disposed within dam 121c can be filled with thermal material 150, wherein adhesion and contact areas between patternings 121 and thermal material 150 can be increased for better heat dissipation, and thermal material 150 can remain contained within dam 121c.

Figure 6A:
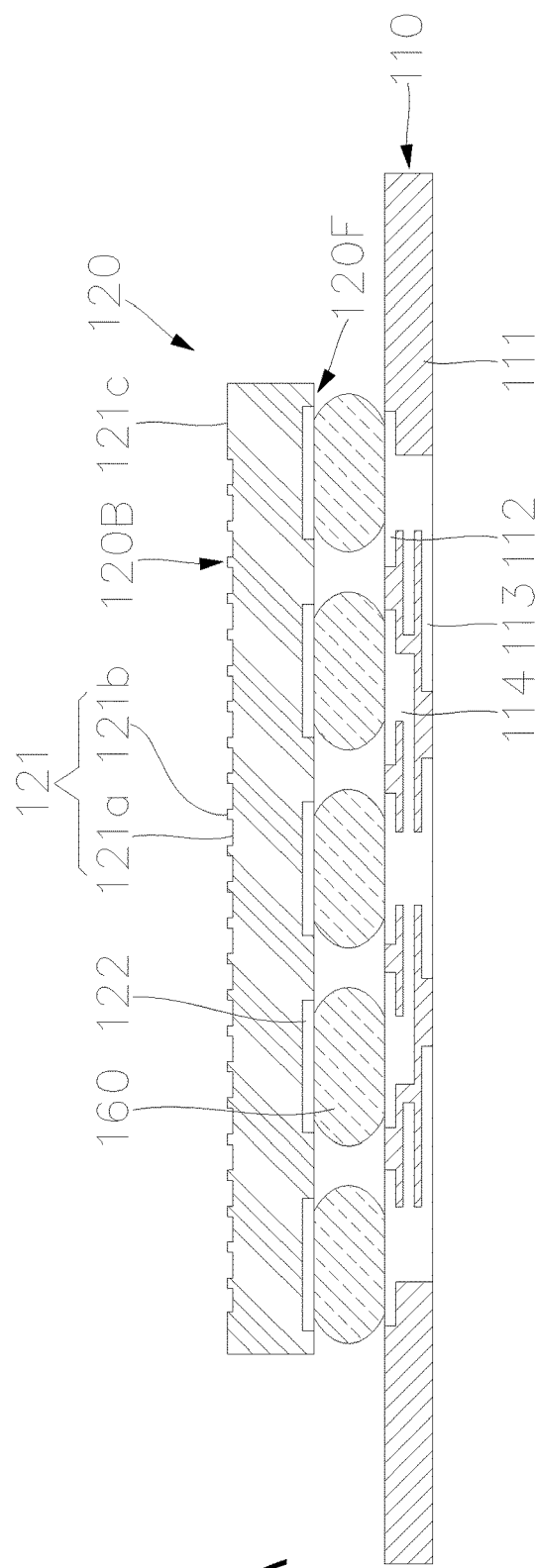

FIGS. 6A to 6F show an example method of manufacturing an example semiconductor device that can correspond to semiconductor device 100 of FIG. 1 and that can include an electronic device 120 similar to any electronic device 120 described in this disclosure. FIG. 6A shows a cross-sectional view of semiconductor device 100 at an early stage of manufacture. In the example shown in FIG. 6A, patternings 121 having valleys 121a and crests 121b and dam 121c can be provided or formed on backside 121B of electronic device 120, and internal interconnects 160 can be provided on front side 121F of electronic device 120. In addition, substrate 110 including dielectric structure 111 comprising one or more dielectric layers, conductor or wiring patterns 112 and 113, and conductive path 114 can be provided. In some examples, wiring patterns 112 and 113 and conductive path 114 can include one or more layers of conductive material. In addition, in some examples, surfaces (top and bottom surfaces) of substrate 110 can be protected by protection layers. In some examples, substrate 110 can be referred to as a printed circuit board (PCB), a printed wiring board, a single side PCB, a double side PCB, a multi-layered PCB, a through hole PCB, a non-through hole PCB, a rigid PCB, a flexible PCB, a paper phenol PCB, a glass epoxy PCB, a polyimide PCB, a polyester PCB, a molded plastic PCB, a ceramic PCB, an etched foil process PCB, an additive process PCB, a buildup PCB, or a pre-molded lead frame.

In some examples, dielectric structure 111 can have substantially planar top and bottom surfaces. In some examples, dielectric structure 111 can comprise or be referred to as one or more dielectric layers. In some examples, dielectric structure 111 can comprise an epoxy resin, a phenol resin, a glass epoxy, polyimide, polyester, an epoxy molding compound, or ceramic. In some examples, a layer of dielectric structure 111 can have a thickness in the range from approximately 0.1 mm to approximately 0.3 mm. Dielectric structure 111 can maintain substrate 110 in a substantially planar state, and can allow wiring patterns 112 and 113 disposed on the surface or the inside of dielectric structure 111, and conductive path 114 of dielectric structure 111, to be electrically coupled to each other.

Upper wiring patterns 112 can be formed on the top surface of dielectric structure 111, and lower wiring patterns 113 can be formed on the bottom surface of dielectric structure 111. In some examples, upper wiring patterns 112 and lower wiring patterns 113 can be referred to as circuit patterns, traces, pads, conductive layers, or conductors. In some examples, upper and lower wiring patterns 112 and 113 can comprise copper, aluminum, iron, nickel, gold, silver, palladium or tin. In some examples, upper and lower wiring patterns 112 and 113 can have thicknesses, widths and spaces in the range from approximately 0.1 mm to approximately 0.3 mm. Upper and lower wiring patterns 112 and 113 can electrically connect electronic device 120 to an external electrical device.

Conductive path 114 can pass through dielectric structure 111 and can electrically connect upper wiring patterns 112 to lower wiring patterns 113. In some examples, conductive path 114 can be a path through more than one conductive layers, where such path can include different vias and different traces linked together along the path. In some examples, conductive path 114 can comprise copper, aluminum, iron, nickel, gold, silver, palladium, or tin. In some examples, conductive path 114 can have a thickness in the range from approximately 0.1 mm to approximately 0.3 mm. In some examples, the thickness of conductive path 114 can correspond to the conductive layers of the conductive path 114. In some examples, conductive path 114 can electrically connect one among upper wiring patterns 112 to another upper wiring pattern 112. In addition, in some examples, conductive path 114 can electrically connect one among lower wiring patterns 113 to another lower wiring pattern 113.

An upper protection layer can generally cover the top surface of dielectric structure 111 and upper wiring patterns 112, and a lower protection layer can generally cover the bottom surface of dielectric structure 111 and lower wiring patterns 113. In some examples, upper protection layer and/or lower protection layer can be referred to as insulating layers, solder masks or solder resists. In some examples, regions of upper wiring patterns 112, on which internal interconnects 160 of electronic device 120 will be mounted, remain exposed from upper protection layer. In addition, regions of lower wiring patterns 113, to which external interconnects 170 will be connected, can remain exposed from the lower protection layer. In some examples, upper protection layer and/or lower protection layer can include polymer, polyimide (PI), benzocyclobutene (BCB), polybenzoxazole (PBO), bismaleimide triazine (BT), a molding material, a phenolic resin, an epoxy, silicone, or an acrylate polymer. In some examples, upper protection layer and/or lower protection layer can have a thickness in the range from approximately 0.1 mm to approximately 0.3 mm. During the manufacture of semiconductor device 100, upper protection layer can protect upper wiring patterns 112 and lower protection layer can protect lower wiring patterns 113.

Substrate 110 can function as a medium for exchanging electrical signals with respect to external electrical devices while supporting electronic device 120. Substrate 110 is provided just as an example for a better understanding of the present disclosure. In some examples, substrate 110 can have a single layered structure, rather than a multi-layered structure. Moreover, substrates having a variety of structures not shown or described can be applied to the present disclosure.

In some examples, substrate 110 can be a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride ($Si_3N_4$), silicon oxide ($SiO_2$), and/or silicon oxynitride (SiON). The inorganic dielectric layer or layers can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 glass epoxy, and these types of RDL substrates can be referred to as a coreless substrate.

In other examples, substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4 glass epoxy, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process.

In the example shown in FIG. 6A, electronic device 120 can be placed or mounted on substrate 110. In some examples, internal interconnects 160 of electronic device 120 can be coupled to upper wiring patterns 112 of substrate 110. In some examples, after electronic device 120 having internal interconnects 160 is mounted on substrate 110, internal interconnects 160 of electronic device 120 can be electrically connected to upper wiring patterns 112 of substrate 110 using a reflow process, a thermal compression process, and/or a laser assist bonding process. Electronic device 120 contacts a conductor or wiring patterns 112 on the top side of substrate 110.

Figure 6B:
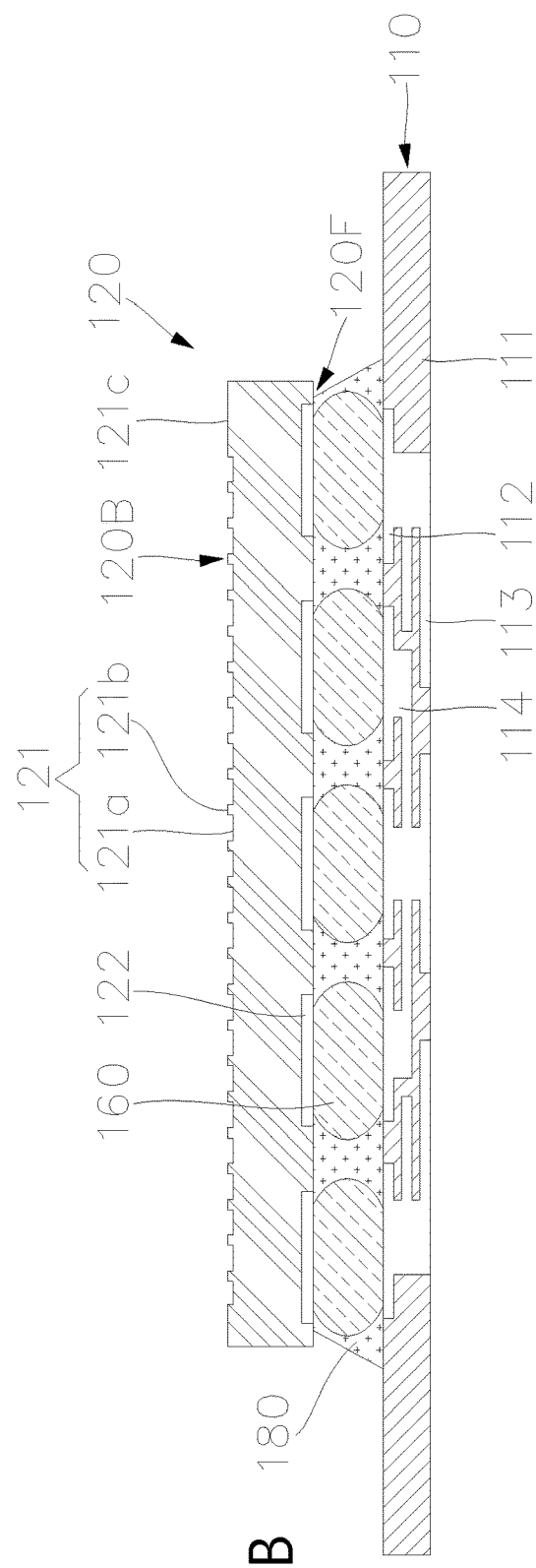

FIG. 6B shows a cross-sectional view of semiconductor device 100 at a later stage of manufacture. In the example shown in FIG. 6B, underfill 180 can be inserted into gaps between electronic device 120 and substrate 110. There can be examples, however, where underfill 180 can be omitted. In some examples, underfill 180 can cover internal interconnects 160 of electronic device 120. In some examples, underfill 180 can be referred to as an insulating paste or a non-conductive paste. In some examples, underfill 180 can be a resin without inorganic fillers. In some examples, after electronic device 120 is electrically connected to substrate 110, underfill 180 can be inserted into gaps between electronic device 120 and substrate 110 using capillary action to then be cured. In some examples, underfill 180 can first be dispensed to cover upper wiring patterns 112 disposed on substrate 110 and can then be electrically connected to upper wiring patterns 112 while internal interconnects 160 of electronic device 120 pass through underfill 180. Underfill 180 can prevent electronic device 120 from being electrically disconnected from substrate 110 due to physical shocks or chemical shocks.

FIG. 6C shows a cross-sectional view of semiconductor device 100 at a later stage of manufacture. In the example shown in FIG. 6C, perimeter structure 130 can be provided on regions of substrate 110 corresponding to outer regions of electronic device 120 and/or underfill 180. In some examples, perimeter structure 130 can be adhered to substrate 110 through adhesive 191. In some examples, perimeter structure 130 can be configured to substantially surround outer regions of electronic device 120 and/or underfill 180. In addition, in some examples, perimeter structure 130 can have a height equal to or slightly greater than that of electronic device 120. In addition, in some examples, a top surface of perimeter structure 130 can be substantially even with backside 121B of electronic device 120.

Perimeter structure 130 can be referred to as a support or a reinforcement member, or a cavity member. In some examples, perimeter structure 130 can be made of a metal such as copper (Cu) or aluminum (Al), an epoxy molding compound, silicon (Si), ceramic, or glass. In some examples, perimeter structure 130 can be formed by electroless plating or electroplating. In an example, perimeter structure 130 can be formed by plating upper wiring patterns 112 of substrate 110 without adhesive 191. In some examples, perimeter structure 130 can be formed by an encapsulation or molding process. In an example, perimeter structure 130 can be formed by directly injecting encapsulant such as molding material onto the top surface of substrate 110 while substrate 110 is placed in a molding tool, without the using or relying on adhesive 191. In some examples, perimeter structure 130 can be a cavity substrate otherwise similar to, for example, one or more of the options described above with respect to substrate 110.

FIG. 6D shows a cross-sectional view of semiconductor device 100 at a later stage of manufacture. In the example shown in FIG. 6D, lid 140 can be provided over electronic device 120 and can be adhered to the backside 121B of electronic device 120 and the top surface of perimeter structure 130 through adhesives 192 and 193, respectively. In some examples, lid 140 can be adhered to the top surface of perimeter structure 130 through adhesive 192. In addition, lid 140 can also be adhered to dam 121c formed on backside 121B of electronic device 120 through adhesive 193. In some examples, gaps or spaces can exist between lid 140 and patternings 121 of electronic device 120. In addition, in some examples, lid 140 can comprise one or more through-holes 141.

In some examples, lid 140 can be referred to as a cover, a case, a heat conductor, a heat spreader, or a heat sink. In some examples, lid 140 can comprise aluminum (Al), an aluminum (Al) alloy, copper (Cu), a copper (Cu) alloy, or stainless steel. Lid 140 can radiate or dissipate the heat generated from electronic device 120 and/or can transfer the heat to substrate 110, functioning as a thermal reservoir using perimeter structure 130. In some examples, thermally conductive adhesives can be used as adhesives 191, 192, and 193 as described in the present disclosure.

Figure 6E:
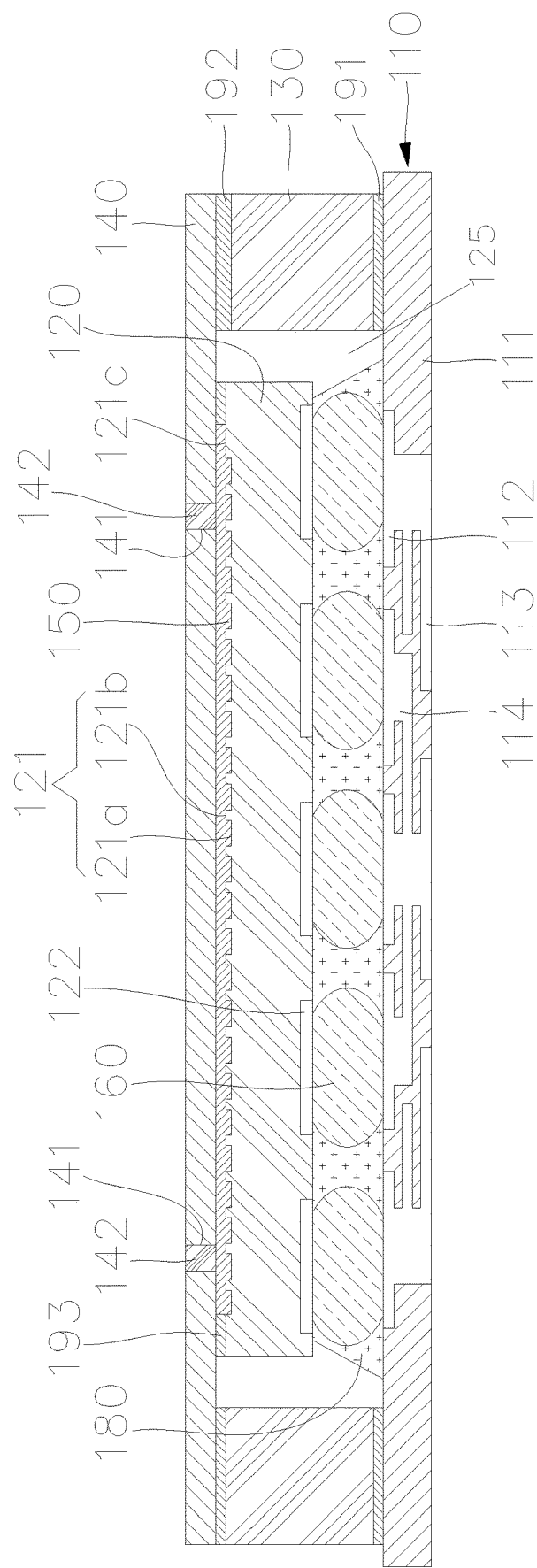

FIG. 6E shows a cross-sectional view of semiconductor device 100 at a later stage of manufacture. In the example shown in FIG. 6E, thermal material 150 can be injected in a through-hole 141 of lid 140 and can fill gaps between electronic device 120 and lid 140 through through-holes 141 of lid 140. In some examples, thermal material 150 can be adhered to lid 140 while covering patternings 121 of electronic device 120. Dam 121c of electronic device 120 can prevent thermal material 150 from overflowing. In some examples, through-holes 141 can be filled or plugged to seal thermal material 150 between lid 140 and the top side of electronic device 120.

In some examples, thermal material 150 can be a cooling medium that can be recirculated. In some examples, thermal material 150 can be air, water, or oil. Thermal material 150 can be recirculated using cooling pipes coupled to through-holes 141 of lid 140 and an external cooling system coupled to cooling pipes. Therefore, the heat radiating or dissipating capability of electronic device 120 (e.g., CPU) can be enhanced. In some examples, thermal material 150 can follow a path determined by patterning 121, such as the zig-zag path shown in FIG. 4A, as it enters through one through-hole 141 and flows towards the other through-hole 141.

In some examples, thermal material 150 can be a Thermal Interface Material (TIM). In some examples, TIM can comprise an inorganic insulating coating material that is a fused composite material of a high thermal conductivity filler (e.g., aluminum nitride (AlN), boron nitride (BN), alumina (Al2O3), silicon carbide (SiC), etc.) and a binder (e.g., a polymer resin). In some examples, the TIM can be an inorganic thermally conductive coating material including a heat resistant binder prepared by a sol-gel process, a thermally conductive material and additives, and the TIM 150 can have a superior thermal conductivity in the range from approximately 100 watts per meter-kelvin (W/m·K) to approximately 400 W/m·K. In this way, the heat generated from electronic device 120 can be rapidly transferred to lid 140 using thermal material 150.

In addition, in some examples, thermal material 150 can be an electrically conductive TIM. In some examples, the TIM can comprise an inorganic coating that is a fused composite material of a high thermal conductivity filler (e.g., carbon fiber, graphite, carbon nanotube, graphene, etc.) and a binder (e.g., a polymer resin). Here, the high thermal conductivity filler, such as carbon fiber, graphite, carbon nanotube, or graphene, has a very high thermal conductivity in an axial or planar direction while having a relatively low thermal conductivity in an orthogonal direction. Therefore, the high thermal conductivity filler, such as carbon fiber, graphite, carbon nanotube, or graphene, can be prepared as an insulating composite material by controlling alignment properties of the high thermal conductivity filler. In some examples, the TIM can have a thermal conductivity in the range from approximately 100 W/m·K to approximately 400 W/m·K, and an electrical conductivity in the range from approximately 3.0 Siemens per centimeter (S/cm) to approximately 5.0 S/cm, thereby performing both a heat dissipating function and an electromagnetic interference (EMI) shielding function.

In some examples, lid 140 and perimeter structure 130 can perform EMI shielding. As described above, since the electrical/thermal TIM is interposed between electronic device 120 and lid 140, both heat dissipating performance and EMI shield performance of semiconductor device 100 can be enhanced. Perimeter structure 130 and lid 140 can be grounded through substrate 110.

In some examples, when thermal material 150 is injected into through-holes 141 of lid 140, through-holes 141 can be then plugged with thermal material 150 or a separate plug 142, thereby preventing moisture or dust from infiltrating into thermal material 150. In some examples, multiple through-holes 141 can be provided in lid 140 wherein thermal material 150 can be injected into one through-hole 141 and air and/or overflow can escape through another through-hole 141.

In some examples, thermal material 150, such as a TIM, can be cured by an annealing process. In some examples, thermal material 150 in a liquid phase is injected into patternings 121 of electronic device 110 through through-holes 141 of lid 140 to then offer a high-heat temperature in the range from approximately 100 degrees Celsius (° C.) to approximately 200° C., thereby allowing the liquid-phase thermal material 150 to undergo a phase change into a solid-phase thermal material 150.

In some examples, thermal material 150 can first be coated on patternings 121 of electronic device 120 and then lid 140 can be adhered to electronic device 120 and perimeter structure 130 through adhesives 192 and 193 while covering thermal material 150. Here, through-holes 141 can be formed in lid 140. In the former case, the coating quantity of thermal material 150 can be accurately controlled to prevent thermal material 150 from leaking out through dam 121c of electronic device 120. In the latter case, however, excess thermal material 150 can leak out through through-holes 141 and the leaked thermal material 150 can be easily removed during the manufacture.

Figure 6F:
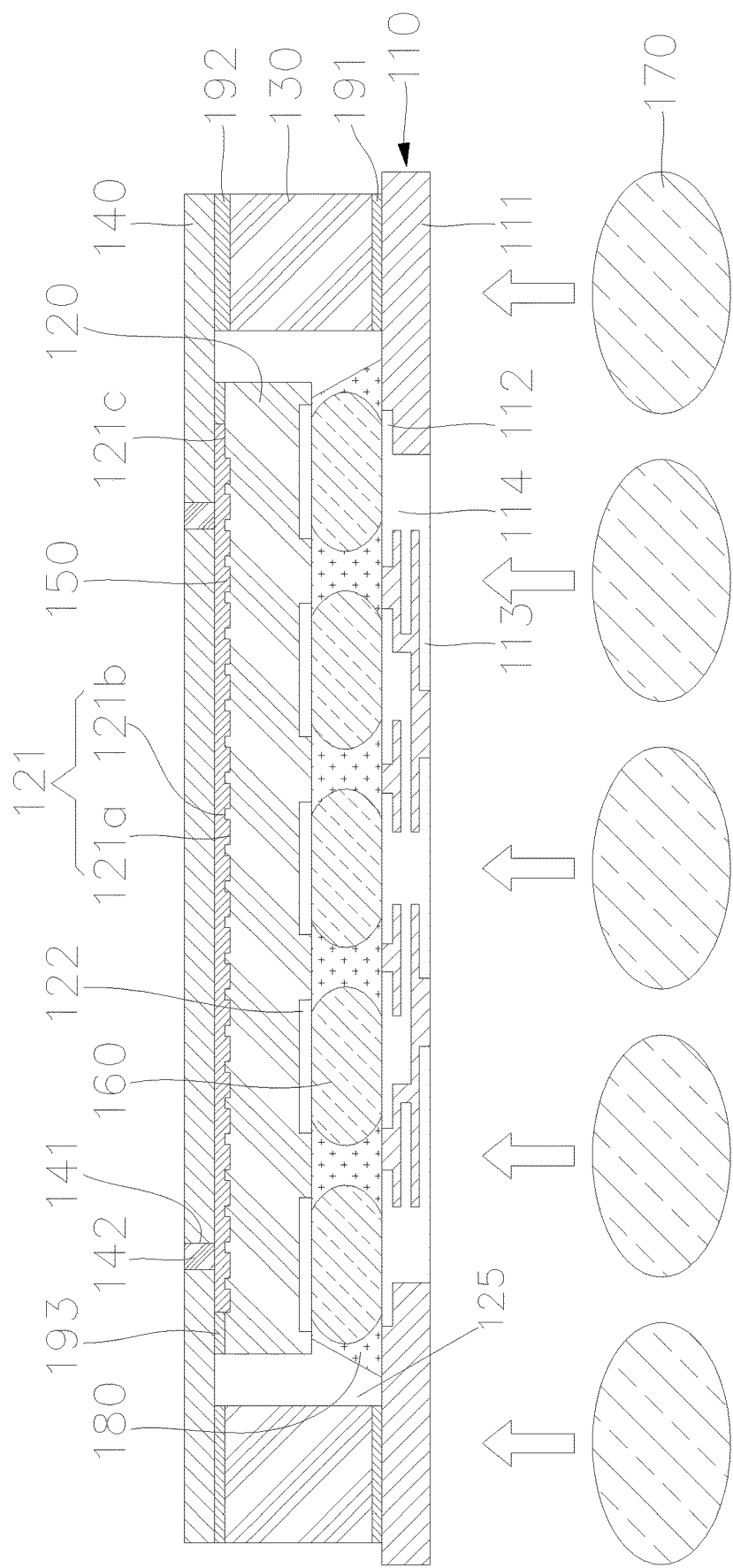

FIG. 6F shows a cross-sectional view of semiconductor device 100 at a later stage of manufacture. In the example shown in FIG. 6F, external interconnects 170 can be connected to lower wiring patterns 113 of substrate 110 exposed through lower protection layer. In some examples, external interconnects 170 can be referred to as solder balls, solder bumps, conductive balls, conductive bumps, copper pillars, copper posts, conductive pillars, conductive posts, pillars having solder caps, or posts having solder caps. In some examples, volatile flux can be dotted to the exposed lower wiring patterns 113, and external interconnects 170 can be dropped on the flux. Thereafter, the flux can be completely volatilized through a reflow process to then be removed, and external interconnects 170 can be melted to then be mechanically and/or electrically connected to lower wiring patterns 113. External interconnects 170 can be cured by a subsequent cooling process to then be completely fixed to lower wiring patterns 113 mechanically and/or electrically. In some examples, external interconnects 170 can include any or more of tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu, or equivalents. External interconnects 170 can connect semiconductor device 100 to an external device. External interconnects 170 can have a thickness in the range from approximately 60 μm to approximately 400 μm and a width in the range from approximately 50 μm to approximately 500 μm. External interconnects 170 can electrically connect semiconductor device 100 or semiconductor package to an external electrical device.

To enhance manufacturability of semiconductor device 100, multiple semiconductor devices 100 and/or semiconductor packages can be manufactured from single substrate 110. Accordingly, a sawing or singulation process can be performed at a later stage of manufacture, thereby completing unitary semiconductor devices 100 or unitary semiconductor packages. In some examples, lid 140, perimeter structure 130 and/or substrate 110 can be subjected to the sawing or singulation process in that order or in reverse order using a diamond blade or laser beam, thereby completing unitary semiconductor devices 100. In some examples, after the sawing or singulation process, side surfaces of lid 140, perimeter structure 130 and/or substrate 110 can be coplanar due to processing characteristics.

Figure 7:
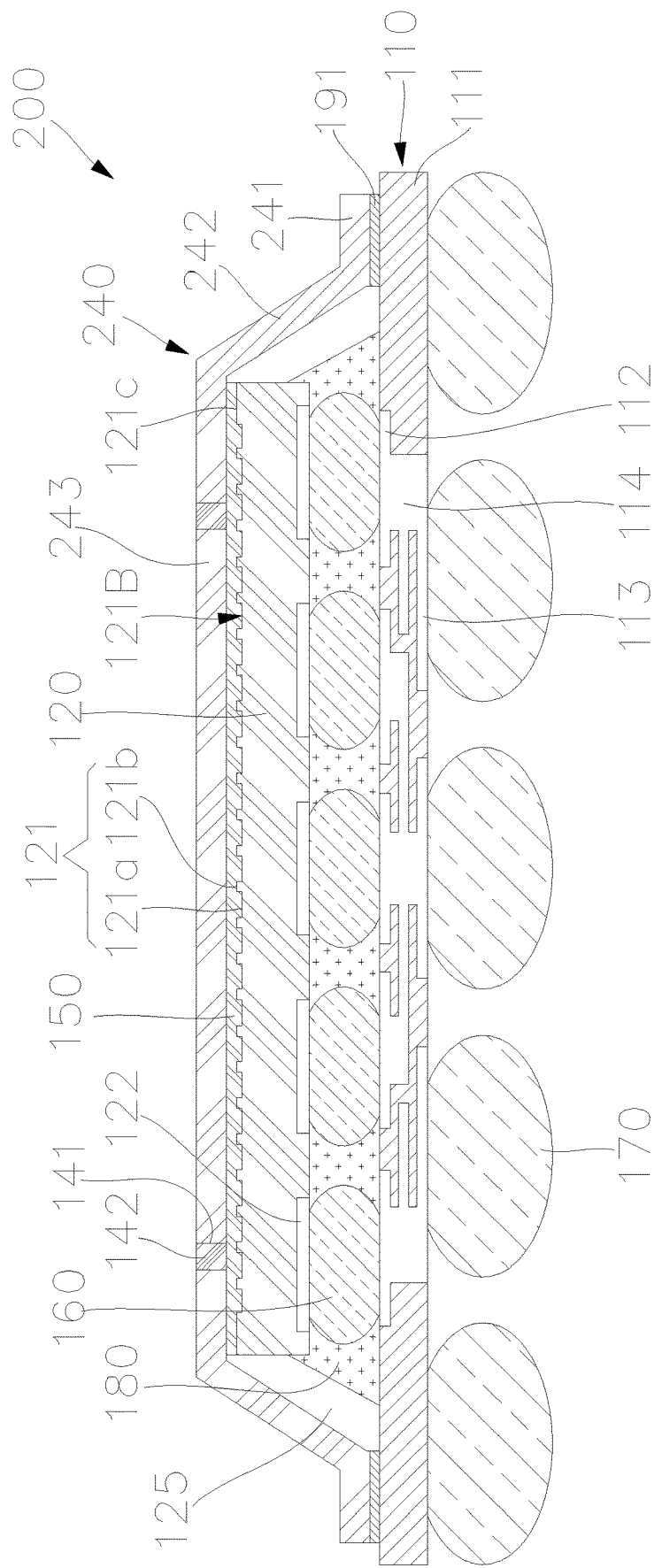
FIG. 7 shows a cross-sectional view of an example semiconductor device.

FIG. 7 shows a cross-sectional view of an example semiconductor device 200. Example semiconductor device 200 can be similar to example semiconductor device 100 of FIG. 1, but comprises lid 240. Lid 240 can comprise base 241 adhered to substrate 110 through adhesive 191, inclined portion 242 extending from base 241 towards a top-end corner of electronic device 120, and planar portion 243 covering backside 121B (or a top surface) of electronic device 120. Here, thermal material 150 can be interposed between planar portion 243 of lid 240 and backside 121B of electronic device 120 (i.e., patternings 121 and dam 121c). In addition, gaps 125 can be formed between electronic device 120 and inclined portion 242 of lid 240. Alternatively, encapsulant can be applied to a region between electronic device 120 and inclined portion 242 of lid 240 to fill the region. As a further alternative, in some examples, lid 240 can comprise through-holes 141 and plug 142 similar to lid 140 of FIG. 1.

In this way, example semiconductor device 200 can be configured such that lid 240 completely covers the surroundings of electronic device 120. Therefore, the heat generated from electronic device 120 can be transferred to substrate 110 functioning as a thermal reservoir while being dissipated or radiated through thermal material 150 and lid 240. In some examples, lid 240 can comprise an EMI shield, and EMI from or to electronic device 120 can be contained or blocked by lid 240.

Figure 8A:
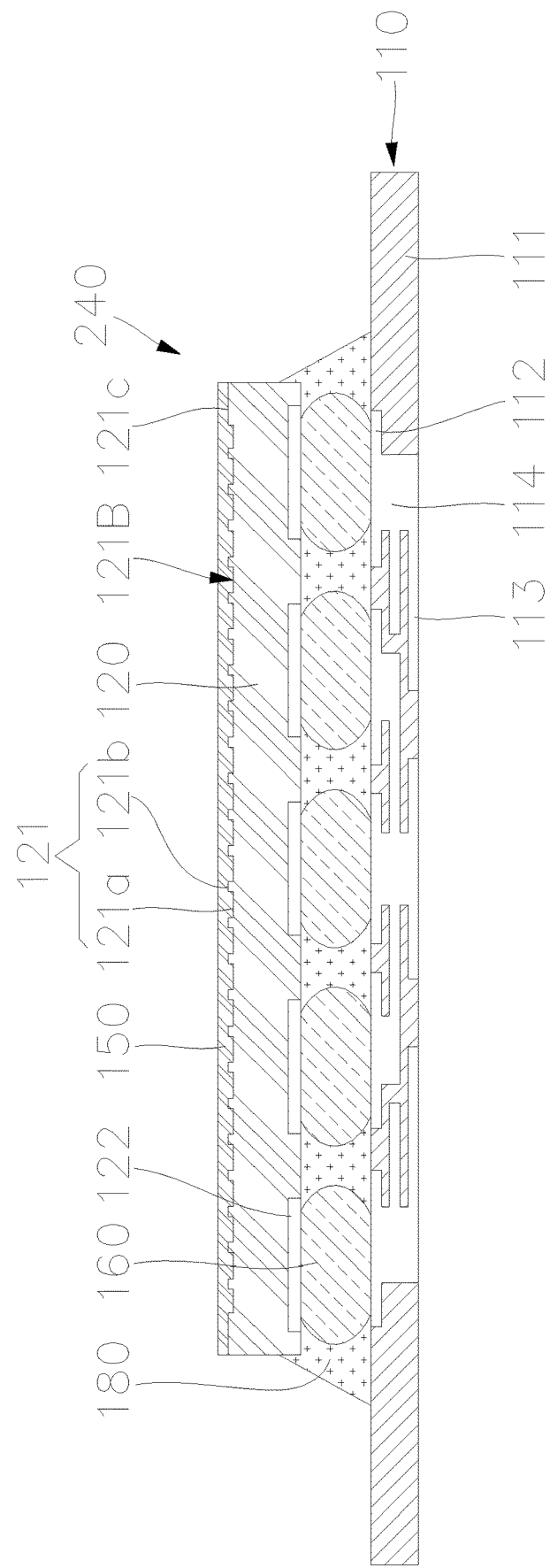
FIGS. 8A and 8B show an example method for manufacturing an example semiconductor device.
Figure 8B:
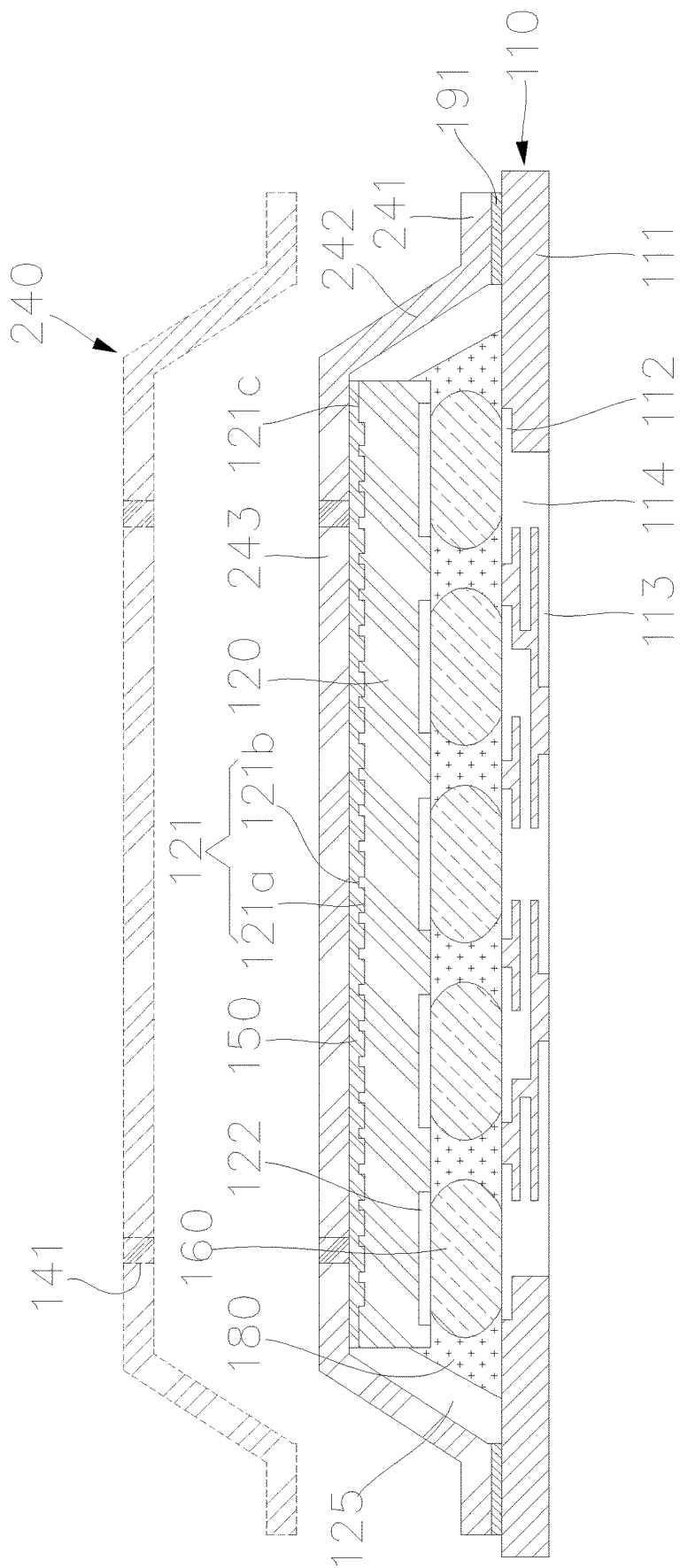

FIGS. 8A and 8B show an example method for manufacturing an example semiconductor device 200. FIG. 8A shows a cross-sectional view of semiconductor device 200 at an initial stage of manufacture. In the example shown in FIG. 8A, thermal material 150 can be attached to backside 121B of electronic device 120. In some examples, thermal material 150 can be attached to patternings 121 and dam 121c formed on backside 121B. In some examples, thermal material 150 can be referred to as a thermally conductive tape or a thermally conductive film. Thermal material 150 can be the same as or similar to thermal material 150 stated above.

Thermal material 150 can be in an A-stage or B-stage (semi-curable) state. Here, the A-stage refers to a state in which a resin and a curing agent are simply mixed according to mixing ratio and a curing reaction does not take place at all, and the B-stage refers to a state in which a reaction between a resin and a curing agent takes place to some extent to rapidly increase the viscosity of thermal material 150, so that thermal material 150 is not soluble in a solvent but is fusible by heat, forming flowability. Here, thermal material 150 can be cured in B-stage in curing the resin and stored at a low temperature to delay a further reaction. Since a curing reaction takes place slowly at a low temperature of approximately −18° C., but is still continuous, the thermal material 150 should be used within a shelf life. The shelf life can be affected by the type of curing agent used and the temperature, and can generally be in a range of approximately several hours to six months.

FIG. 8B shows a cross-sectional view of semiconductor device 200 at a later stage of manufacture. In the example shown in FIG. 8B, lid 240 can be attached. In some examples, lid 240, including base 241, inclined portion 242 and planar portion 243, can be attached to adhesive 191 disposed on substrate 110 and to thermal material 150 disposed on electronic device 120. In some examples, a thermal compression process can be used with a temperature in the range from approximately 100° C. to approximately 200° C. In some examples, a thermal compression head with a temperature in the range from approximately 100° C. to approximately 200° C. can press base 241 and planar portion 243 of lid 240.

Through the above-described process, the viscosities of thermal material 150 and adhesive 191 can be further lowered, and flowability can be enhanced. Eventually, the reactant can be completely cured (C-stage). Here, the C-stage refers to a state in which a reaction between a resin and a curing agent is almost finished or is completed, and a material can be completely cured without being affected by a solvent or heat. There can be other examples where thermal material 150 can be applied first to lid 240, and then coupled to patternings 121 over electronic device 120 when lid 240 is attached. There can also be examples where thermal material 150 can be applied after lid 240 is attached, such as by inserting thermal material 150 via a through-holes 141 as described, for example with respect to FIG. 6E. Through-holes 141 can be plugged using separate plug 142 or the same thermal material 150.

Figure 9:
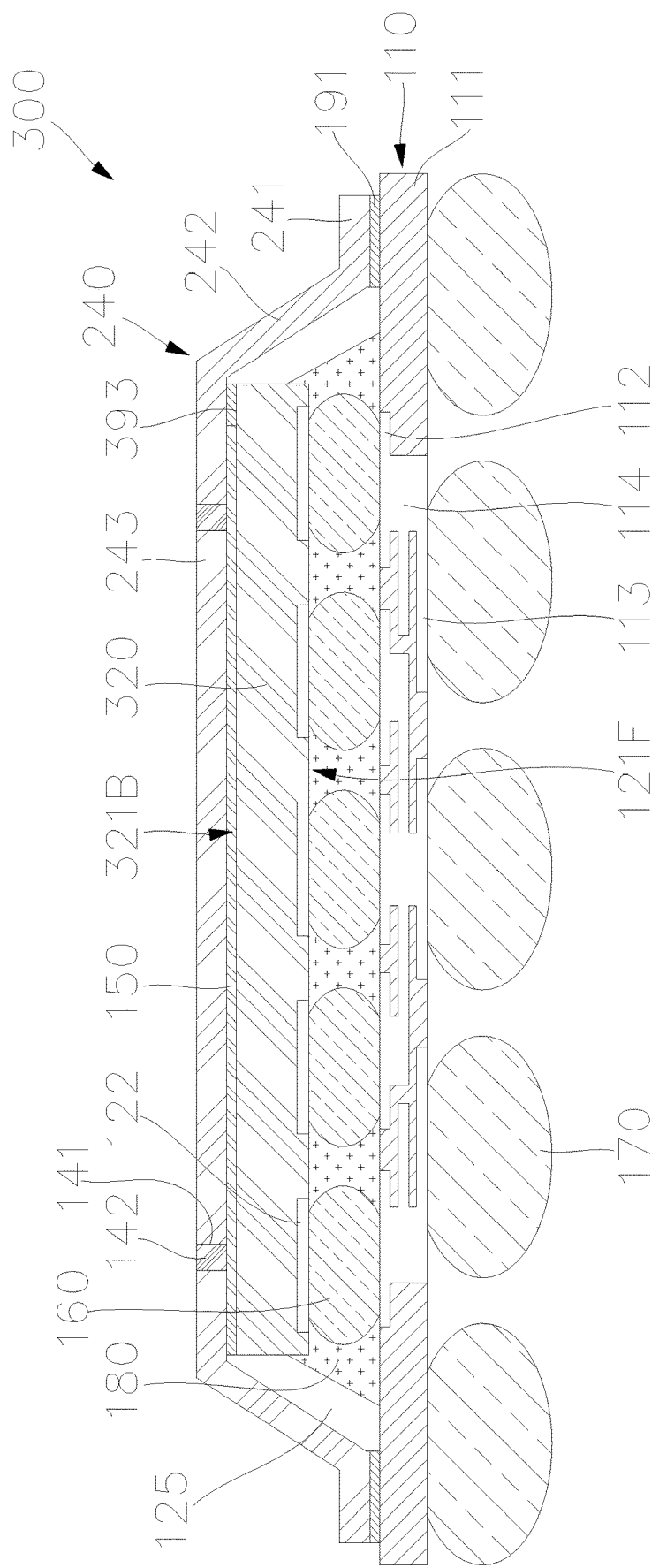
FIG. 9 shows a cross-sectional view of an example semiconductor device.

FIG. 9 shows a cross-sectional view of an example semiconductor device 300. Example semiconductor device 300 can be similar to example semiconductor device 200 of FIG. 7 except that there is an adhesive 393 between electronic device 120 and lid 240. In the example shown in FIG. 9, semiconductor device 300 can comprise lid 240. In addition, in some examples, electronic device 320 can have a substantially planar backside 321B, but there can be examples where electronic device 320 can comprise patternings 121 as described above. In addition, in some examples, tape or film-type adhesive 393 can be formed on the periphery of the backside 321B, and a thermal material 150 can fill the backside 321B corresponding to an interior region of adhesive 393. Here, the planar portion 243 of lid 240 can be attached to adhesive 393 and thermal material 150. Further, adhesive 393 can be referred as a dam that prevents overflow of thermal material 150.

Figure 10C:
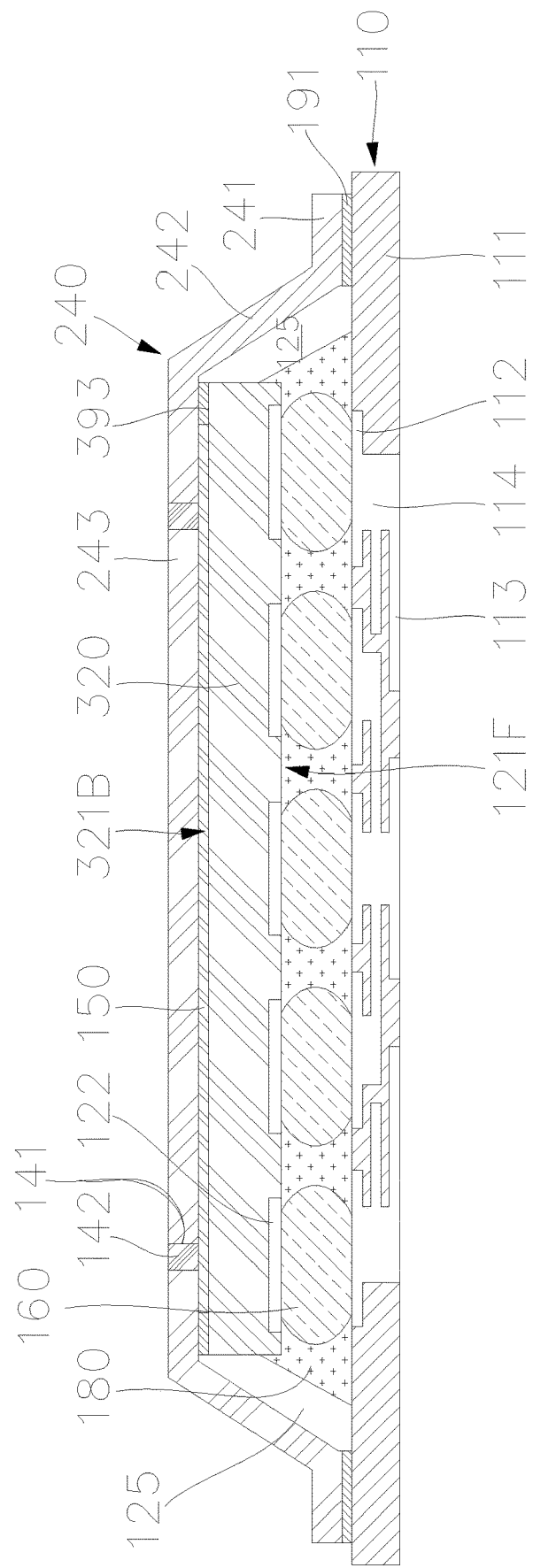

FIGS. 10A to 10C show an example method for manufacturing an example semiconductor device 300. FIG. 10A shows a cross-sectional view of semiconductor device 300 at an initial stage of manufacture. In the example shown in FIG. 10A, adhesive 393 can be applied around backside 321B of electronic device 320. In some examples, adhesive 393 can be a thermally conductive adhesive. Adhesive 393 can be in an A-stage or B-stage (semi-curable) state. Backside 321B of electronic device 320 can remain exposed within a perimeter of adhesive 393.

FIG. 10B shows a cross-sectional view of semiconductor device 300 at a later stage of manufacture. In the example shown in FIG. 10B, thermal material 150 can be dispensed on a region of backside 321B of electronic device 320, within the perimeter of adhesive 393. In some examples, thermal material 150 can be applied in a liquid phase. Adhesive 393 can prevent thermal material 150 from overflowing.

FIG. 10C shows a cross-sectional view of semiconductor device 300 at a later stage of manufacture. In the example shown in FIG. 10C, lid 240 can be attached to adhesive 393 and thermal material 150. In some examples, a thermal compression process can be used with a temperature in the range from approximately 100° C. to approximately 200° C. In some examples, a thermal compression head with a temperature in the range from approximately 100° C. to approximately 200° C. can press base 241 and planar portion 243 of lid 240. Through above-described process, adhesive 393 and thermal material 150 can be cured to the C-stage.

Figure 11:
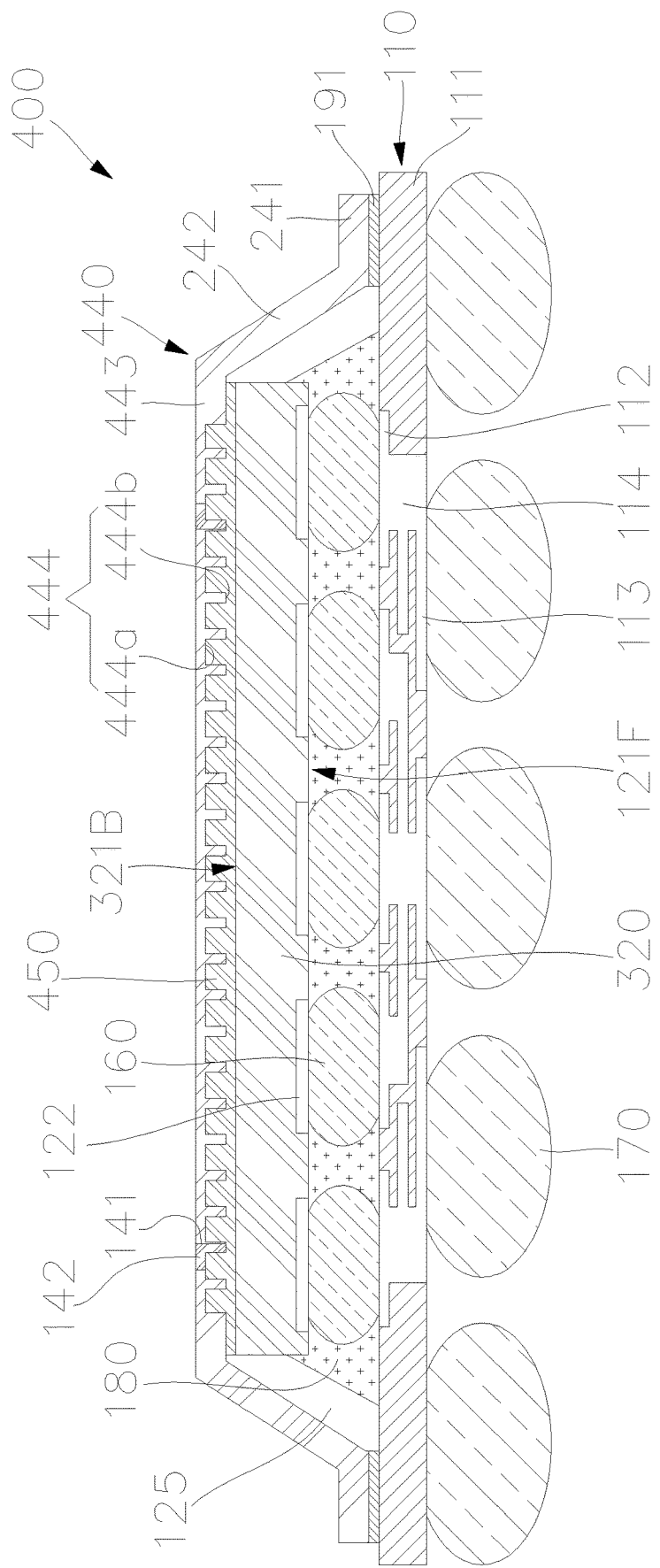
FIG. 11 shows a cross-sectional view of an example semiconductor device.

FIG. 11 shows a cross-sectional view of an example semiconductor device 400. Example semiconductor device 400 can be similar to example semiconductor device 200 of FIG. 7, but comprises lid 440 having patternings 444. In some examples, patternings 444 can be formed on a bottom surface of a planar portion 443 of lid 440. Patternings 444 can be formed by stamping and/or etching, such as through a plasma etching processes including, but not limited to, Reactive Ion Etching (RIE), Magnetically-Enhanced RIE (MERIE), Electron Cyclotron Resonance (ECR), Transformer Coupled Plasma (TCP), Inductively Coupled Plasma (ICP), Helical Plasma, Helicon Plasma, High Density Plasma (HDP), or equivalents. Alternatively, patternings 444 can be formed by a laser process. In some examples, carbon dioxide (CO2) lasers, fiber lasers, disk lasers, semiconductor lasers, or Yttrium Aluminum Garnet (YAG) lasers can be used for providing patternings 444 on planar portion 443 of lid 440. In some examples, an intensity, time, and/or path of the laser beam can be adjusted so that patternings 444 of a desired shape can be formed. In some examples, patternings 144 can have lattice patterns, line patterns, trench patterns, and/or dot patterns similar to FIGS. 4A and 5J. In some examples, patternings 444 can have depths, widths, and/or spaces in the range from approximately 1 µm to approximately 100 µm.

In some examples, thermal material 150 can be interposed between patternings 444 of lid 440 and backside 321B of electronic device 320. Thermal material 150 can adhere the substantially planar backside 321B of electronic device 320 and uneven patternings 444 of lid 440 to each other. In some examples, thermal material 150 can be interposed into valleys 444a and crests 444b of patternings 444. Therefore, adhesion and contact areas between patternings 444 and thermal material 150 can be increased for better heat dissipation.

Figure 12:
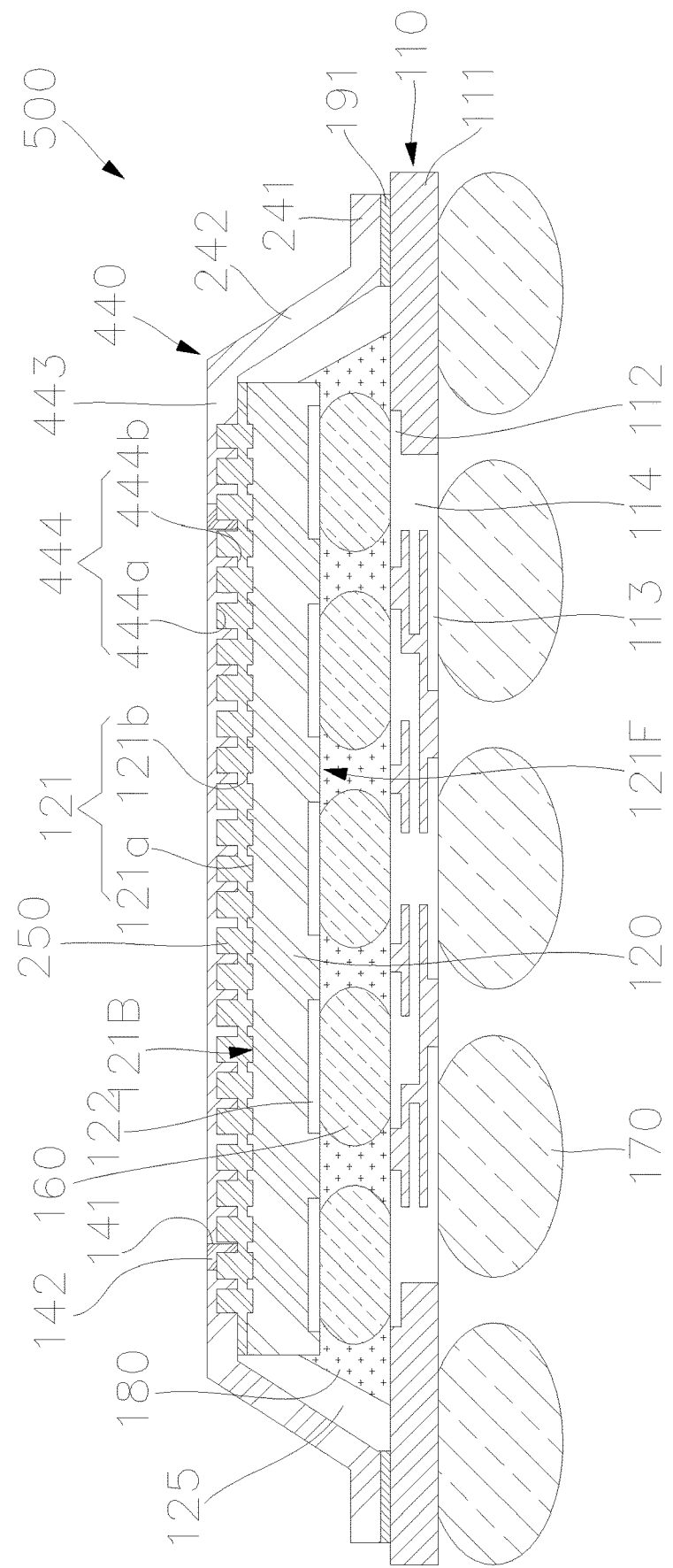
FIG. 12 shows a cross-sectional view of an example semiconductor device.

FIG. 12 shows a cross-sectional view of an example semiconductor device 500. Example semiconductor device 500 can be similar to example semiconductor device 400 of FIG. 11, but comprises both patternings 121 and 444. In the example shown in FIG. 12, semiconductor device 500 can comprise lid 440 having patternings 444 and electronic device 120 having patternings 121. In some examples, thermal material 150 can be interposed between patternings 121 of electronic device 120 and patternings 444 of lid 440. In some examples, the patterns or paths defined by patternings 444 of lid 440 can be complementary to the patterns or paths defined by patternings 121 of electronic device 120. In some examples, thermal material 150 can be adhered to valleys 444a and crests 444b of patternings 444 formed in lid 440 and valleys 121a and crests 121b of patternings 121 formed in electronic device 120, respectively. Therefore, adhesion and contact areas between patternings 121 and 444 and thermal material 150 can be further increased for better heat dissipation.

In some examples, patternings 121 of electronic device 120 and patternings 444 of lid 440 can be formed complementary to each other or to alternate each other, and/or can jointly define paths, such as the zig-zag paths shown with respect to FIG. 4A-B, for thermal material 150. In an example, valleys 444a of lid 440 can be positioned to correspond to valleys 121a of patternings 121, and crests 444b of lid 440 can be positioned to correspond to crests 121b of patternings 121. In an example, crests 444b of lid 440 can be positioned to correspond to valleys 121a of patternings 121, and valleys 444a of lid 440 can be positioned to correspond to crests 121b of patternings 121.

Figure 13:
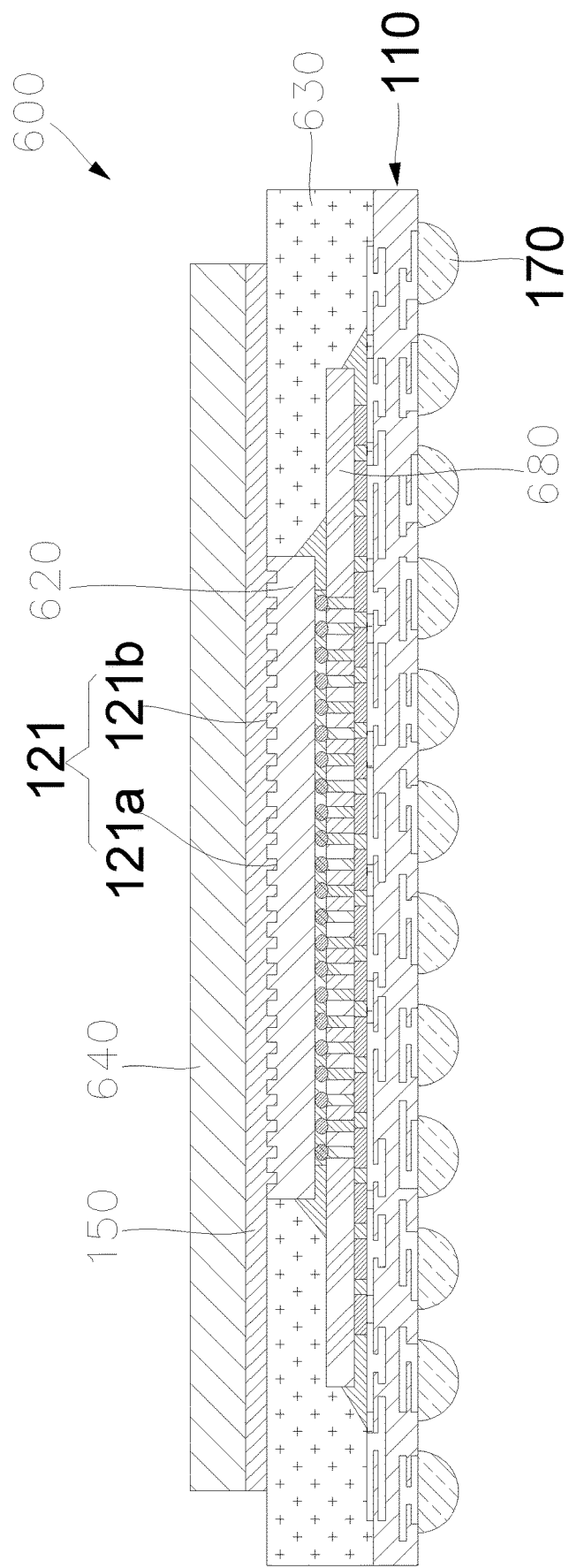
FIG. 13 shows a cross-sectional view of an example semiconductor device.

FIG. 13 shows a cross-sectional view of an example semiconductor device 600. Semiconductor device 600 can be similar to one or more of the examples described above, but comprises lid 640 and encapsulant 630. Example semiconductor device 600 can be similar to example semiconductor device 100 of FIG. 1. For example, lid 640 can correspond or be similar to lid 140 from example semiconductor device 100. Further, encapsulant 630 can correspond or be similar to perimeter structure 130 from example semiconductor device 100. For example, encapsulant 630 can comprise a mold compound or molded structure. Encapsulant 630 can be on a top side of substrate 110 adjacent to electronic device 120. Lid 640 can comprise or be referred to as a heat sink. In the example shown in FIG. 13, semiconductor device 600 can comprise substrate 110, interposer 680 electrically connected to substrate 110, electronic device 120 electrically connected to interposer 680, encapsulant 630 encapsulating interposer 680, and electronic device 120, which are disposed on substrate 110, lid 640 adhered to top surfaces of electronic device 120, and encapsulant 630 using thermal material 150, and external interconnects 170 connected to substrate 610. In some examples, lid 640 can have through-holes 141 or no through-holes 141.

Patternings 121 can be formed on a top surface or backside of electronic device 120 and thermal material 150 can be adhered to patternings 121. Thermal material 150 can be between the top side of electronic device 120 and lid 640. In some examples, patternings 121 can include valleys 121a and crests 121b. Accordingly, adhesion areas and/or heat dissipation between electronic device 120 and thermal material 150 can be increased by patternings 121.

Figure 14:
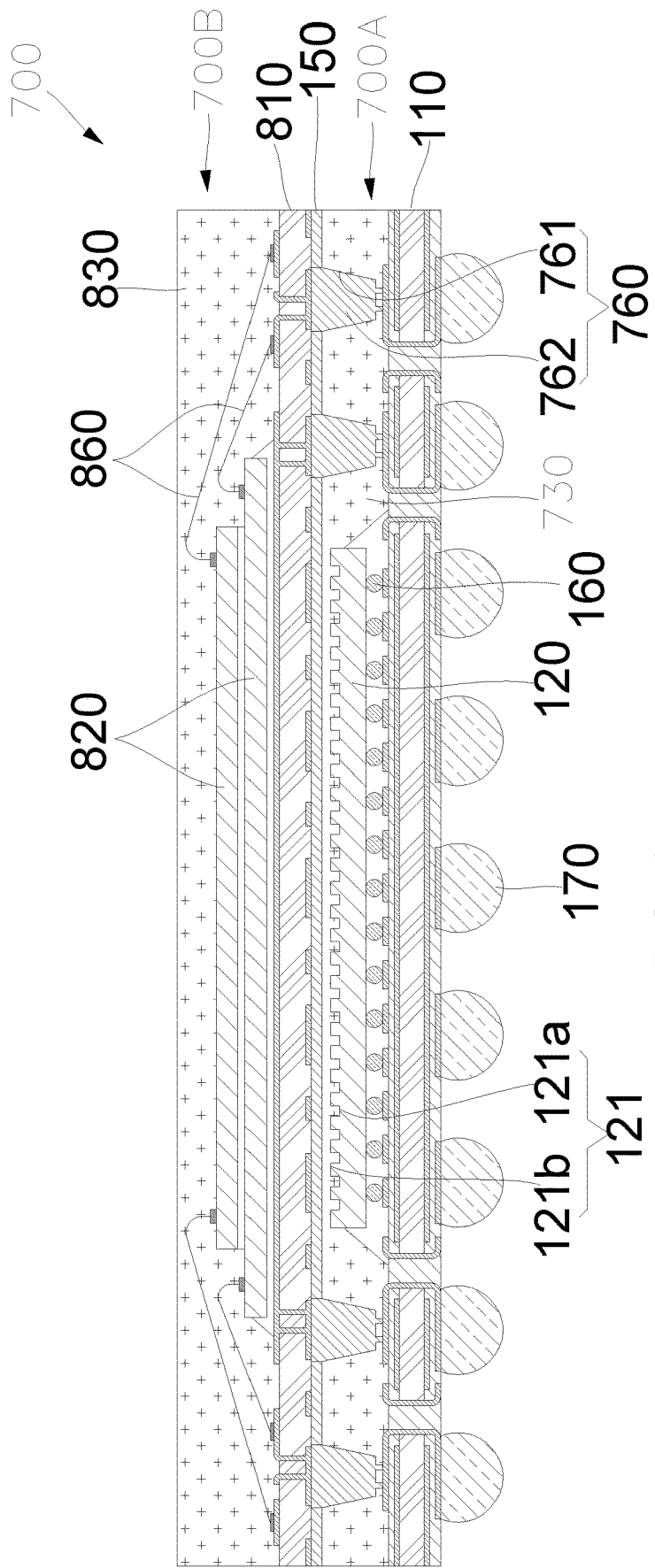
FIG. 14 shows a cross-sectional view of an example semiconductor device.

FIG. 14 shows a cross-sectional view of an example semiconductor device 700. Example semiconductor device 700 can be similar to example semiconductor device 600 of FIG. 13, but can comprise a Three-Dimensional (3D) or Package on Package (POP) configuration. In some examples, semiconductor device 700 can comprise lower package 700A and upper package 700B. Lower package 700A can comprise substrate, electronic device 120 connected to substrate 110 through internal interconnects 160 connected to a conductor or wiring patterns on the top side of substrate 110, encapsulant 730 encapsulating internal interconnects 160 and electronic device 120 on substrate 110, and external interconnects 170 connected to substrate 110. In some examples, encapsulant 730 can be similar to encapsulant 630.

In addition, upper package 700B can comprise substrate 810, one or more electronic devices 820 connected to substrate 810 through internal interconnects 860, and encapsulant 830 encapsulating electronic devices 820 on substrate 810. In some examples, substrate 810 can be similar to substrate 110, and encapsulant 830 can be similar to encapsulant 630. Although internal interconnects 860 are presented as wirebond interconnects, there can be examples where one or more internal interconnects 860 can be in some respects similar to interconnects 160.

In some examples, lower package 700A and upper package 700B can be connected to each other through vertical interconnects 760. For example, each of vertical interconnects 760 can include through-hole 761 in encapsulant 730 of lower package 700A, and conductor 762 filling through-hole 761, thereby electrically connecting substrate 710 of lower package 700 and substrate 810 of upper package 700B to each other. In some examples, vertical interconnects 760 can comprise a through-mold-via (TMV) structure.

Electronic device 120 of lower package 700A can comprise multiple patternings 121 formed on a top surface, top side, or backside, of electronic device 120. Patternings 121 can have valleys 121a and crests 121b for better heat dissipation. Encapsulant 730 can be between the patternings 121 of electronic device 120 and can be adhered to valleys 121a and crests 121b. Heat generated from electronic device 720 can be transferred through encapsulant 730, and a coupling force between electronic device 120 and encapsulant 730 can be increased. In some examples, crests 121b and/or valleys 121a of patternings 121 can remain exposed from encapsulant 730. In the same or other examples, patternings 121 can be coupled to an inter-package material, such as an adhesive or thermal material 150, between lower package 700A and upper package 700B.

The present disclosure includes reference to certain examples. It will be understood, however, by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

The invention claimed is:

1. A semiconductor device, comprising:
a substrate having a top side and a conductor on the top side of the substrate;
an electronic device on the top side of the substrate connected to the conductor on the top side of the substrate via an internal interconnect;
a lid covering a top side of the electronic device; and
a thermal material between the top side of the electronic device and the lid, wherein the lid has a through-hole;
wherein the top side of the electronic device comprises patternings, and a portion of the thermal material is disposed between the patternings; and
further comprising:
a dam at a perimeter of the electronic device and contacting the thermal material.

2. The semiconductor device of claim 1, further comprising a perimeter structure between the lid and the top side of the substrate to secure the lid to the substrate.

3. The semiconductor device of claim 1, wherein a portion of the lid is secured to the top side of the substrate.

4. The semiconductor device of claim 1, wherein the patternings comprise a trench pattern.

5. The semiconductor device of claim 1, wherein the patternings comprise a parallel pattern.

6. The semiconductor device of claim 1, wherein the patternings comprise a zig-zag pattern to distribute the thermal material across the electronic device when the thermal material is introduced into the patternings via the through-hole before the through-hole is filled.

7. The semiconductor device of claim 1, wherein a bottom side of the lid comprises lid patternings, and a portion of the thermal material is disposed between the lid patternings.

8. The semiconductor device of claim 1, wherein the through-hole is filled.

9. The semiconductor device of claim 1, wherein the thermal material comprises a coolant medium that can be circulated through the through-hole via a cooling pipe.

10. The semiconductor device of claim 1, wherein the substrate comprises a redistribution layer (RDL) substrate.

11. The semiconductor device of claim 1, further comprising an adhesive between the lid and the top side of the electronic device, wherein the thermal material is in an internal region between the adhesive and the top side of the electronic device.

12. The semiconductor device of claim 1, wherein the dam is at a periphery of the patternings.

13. The semiconductor device of claim 1, wherein the dam comprises an adhesive contacting a bottom side of the lid.

14. The semiconductor device of claim 1, wherein the dam contains the thermal material within the perimeter of electronic device.

15. The semiconductor device of claim 1, wherein the patternings comprise a crest having a length that is less than half a length of the electronic device.

16. A method to manufacture a semiconductor device, comprising:
providing patternings on a backside of an electronic device;
placing the electronic device on a top side of a substrate, wherein the electronic device contacts a conductor on the top side of the substrate via an internal interconnect;
providing a lid over the electronic device;
injecting a thermal material into a through-hole of the lid; and
filling the through-hole to seal the thermal material between the lid and the top side of the electronic device;
wherein a portion of the thermal material is disposed between the patternings; and
further comprising:
providing a dam at a perimeter of the electronic device and contacting the thermal material.

17. The method of claim 16, further comprising providing a perimeter structure on the top side of the substrate at a periphery of the electronic device, wherein the lid is adhered to the perimeter structure and the perimeter structure is adhered to the top side of the substrate.

18. The method of claim 16, further comprising adhering a portion of the lid to the top side of the substrate.

19. The method of claim 16, further comprising providing an encapsulant on the top side of the substrate at a periphery of the electronic device, wherein a portion of the lid covers a portion of the encapsulant.

* * * * *